US012003246B2

(12) United States Patent
Perrott et al.

(10) Patent No.: US 12,003,246 B2
(45) Date of Patent: Jun. 4, 2024

(54) METHODS AND SYSTEMS FOR ATOMIC CLOCKS WITH HIGH ACCURACY AND LOW ALLAN DEVIATION

(71) Applicant: TEXAS INSTRUMENTS INCORPORATED, Dallas, TX (US)

(72) Inventors: Michael Perrott, Nashua, NH (US); Bichoy Bahr, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/731,795

(22) Filed: Apr. 28, 2022

(65) Prior Publication Data

US 2022/0407528 A1  Dec. 22, 2022

Related U.S. Application Data

(60) Provisional application No. 63/213,590, filed on Jun. 22, 2021.

(51) Int. Cl.
*H03L 7/26* (2006.01)
*G04F 5/14* (2006.01)
*G06F 1/04* (2006.01)
*H03K 3/011* (2006.01)
*H03K 5/00* (2006.01)

(52) U.S. Cl.
CPC ............ *H03L 7/26* (2013.01); *G04F 5/14* (2013.01); *G06F 1/04* (2013.01); *H03K 3/011* (2013.01); *H03K 5/00006* (2013.01)

(58) Field of Classification Search
CPC .................................................. H03L 7/26
USPC ............................................ 331/94.1
See application file for complete search history.

(56) References Cited

U.S. PATENT DOCUMENTS

| 8,159,736 B2 | 4/2012 | Maleki et al. |
| 8,774,317 B2 | 7/2014 | Eliezer |
| 8,831,056 B2 | 9/2014 | Savchenkov et al. |
| 10,389,514 B2 | 8/2019 | Sinclair et al. |

(Continued)

FOREIGN PATENT DOCUMENTS

WO  2006036268 A2  4/2006

OTHER PUBLICATIONS

International Search Report dated Oct. 11, 2022.

*Primary Examiner* — Joseph Chang
(74) *Attorney, Agent, or Firm* — Frank D. Cimino

(57) ABSTRACT

A system comprises a digital processing circuit, a frequency modulator, an amplitude modulator, and an adder. The digital processing circuit receives an input signal and a correlation signal and generates a frequency tuning parameter and an amplitude modulation parameter. The frequency modulator generates a frequency modulation signal and the correlation signal. The amplitude modulator receives the amplitude modulation parameter and generates an amplitude modulation signal. The adder receives the frequency tuning parameter and the frequency modulation signal and generates a control signal. In some implementations, the system further comprises a DC feedback circuit that receives the input signal and generates a DC compensation signal. In some implementations, the system further comprises a temperature sensor, a temperature compensation circuit, and a second adder.

26 Claims, 23 Drawing Sheets

(56) References Cited

U.S. PATENT DOCUMENTS

| | | | |
|---|---|---|---|
| 2013/0147565 A1* | 6/2013 | Aoyama | H03B 17/00 331/94.1 |
| 2015/0091660 A1* | 4/2015 | Tanaka | H03L 7/26 331/94.1 |
| 2020/0044658 A1* | 2/2020 | Maki | H03L 7/26 |
| 2021/0297085 A1* | 9/2021 | Shijo | G01R 33/26 |
| 2022/0155730 A1* | 5/2022 | Ye | H01S 3/0085 |

* cited by examiner

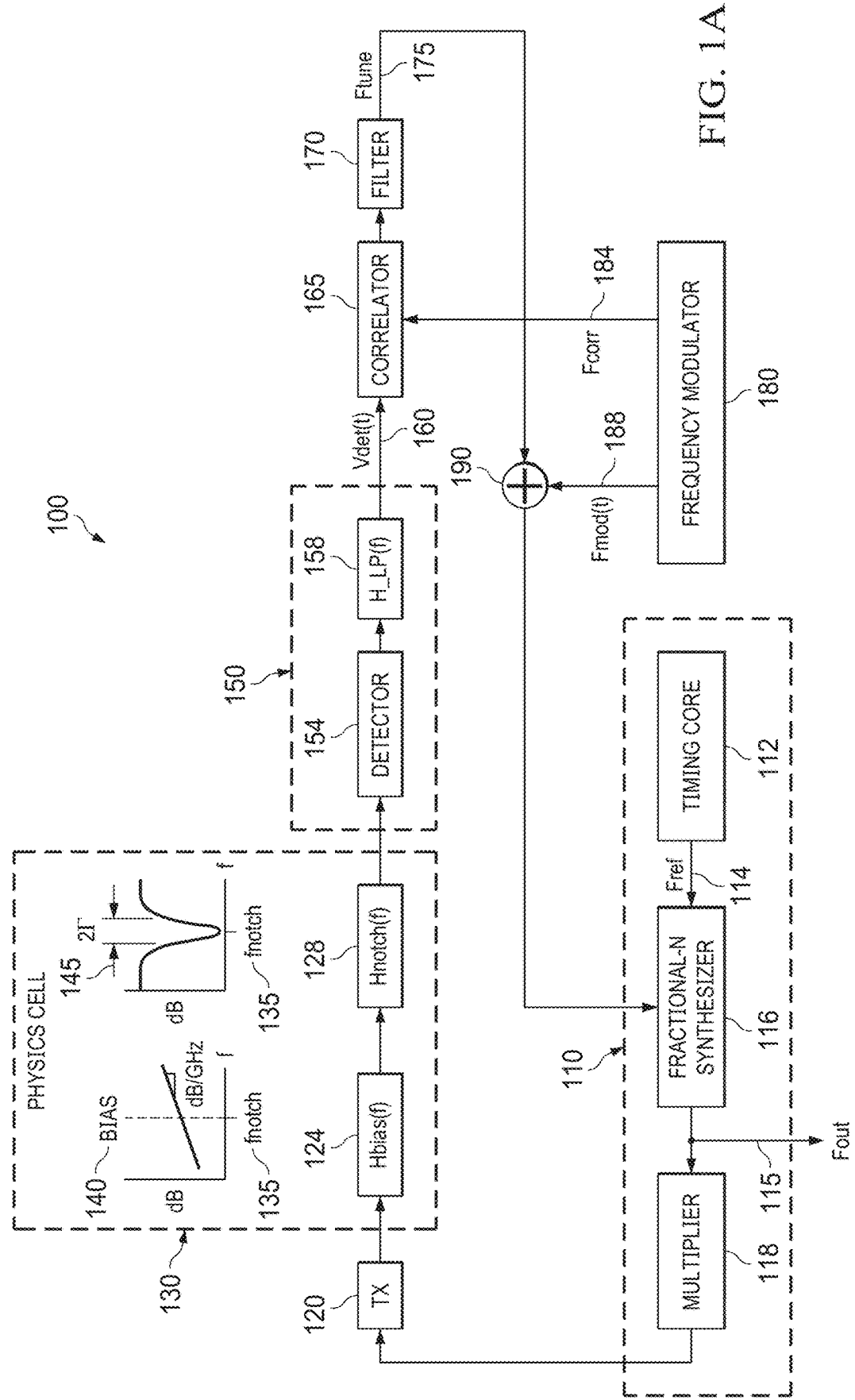

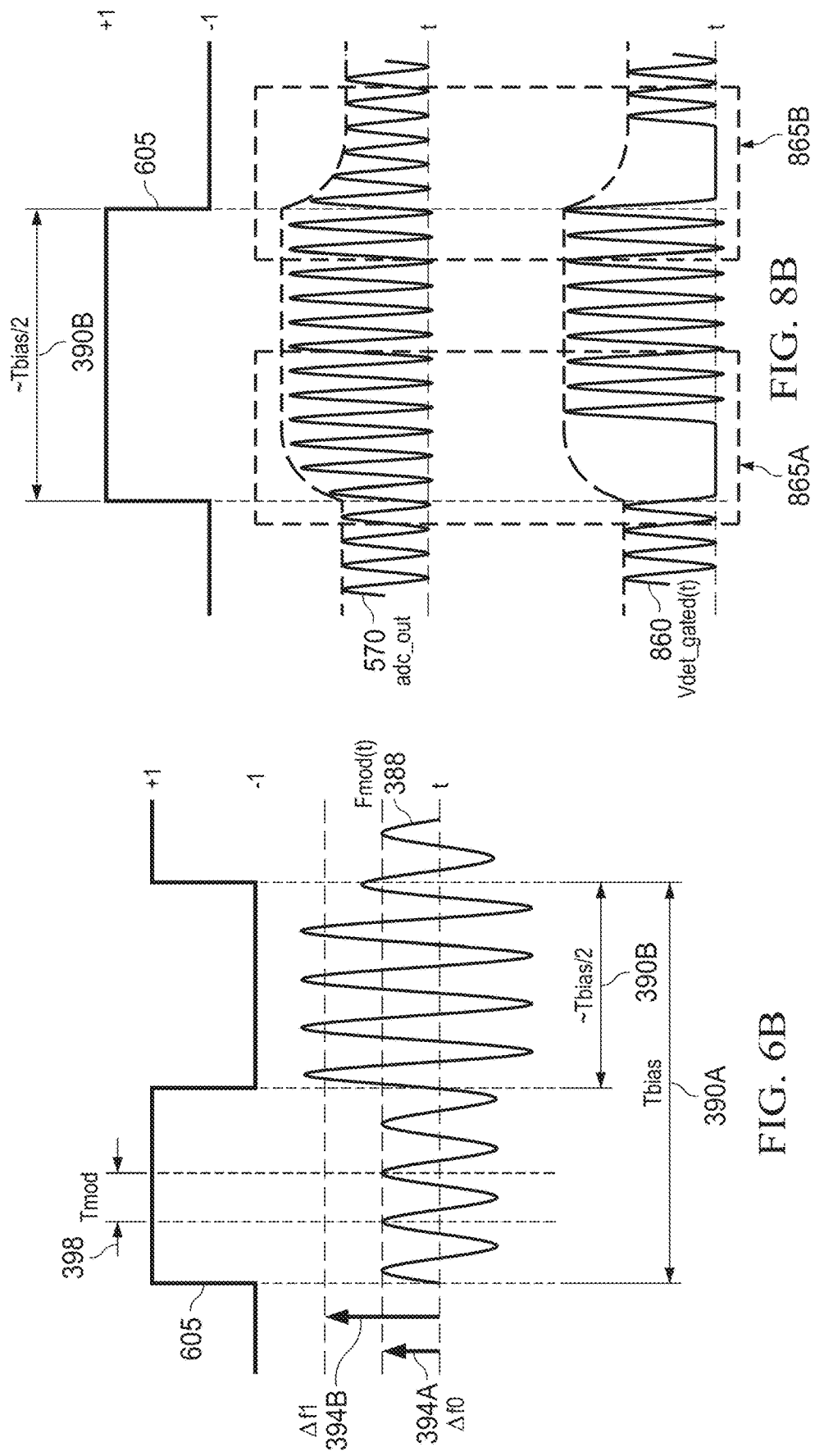

METHODS AND SYSTEMS FOR ATOMIC CLOCKS WITH HIGH ACCURACY AND LOW ALLAN DEVIATION

CROSS-REFERENCE TO RELATED APPLICATIONS

This application claims priority to U.S. Provisional Application No. 63/213,590, filed Jun. 22, 2021, which is hereby incorporated by reference.

BACKGROUND

Molecular clocks are used to generate highly accurate clock signals such as for global positioning systems, global navigation satellite systems, and radio access networks with high capacity, high density, and low latency, among others. In the case of molecular clocks utilizing radio frequency (RF) signals, reflections in the physics cell of the molecular clock or frequency modulation to amplitude modulation (FM to AM) conversions by the transmitter of the molecular clock can introduce a frequency-dependent variation, referred to as bias (also known as tilt), in the signal output by the physics cell detector. The sensitivity of bias to process, voltage, and temperature variations can correspondingly cause the tuning frequency of the molecular clock to deviate from the absorption frequency of the physics cell. To address this issue, some molecular clocks reduce sensitivity to bias by correlating with higher order, odd harmonics of the frequency modulation signal, but at the cost of a smaller signal-to-noise ratio compared to correlating with the fundamental harmonic. In addition, some sensitivity to bias remains which can impact the frequency accuracy and Allan deviation of the molecular clock.

SUMMARY

A system includes a digital processing circuit, a frequency modulator, an amplitude modulator, and an adder. The digital processing circuit receives an input signal and a correlation signal and generates a frequency tuning parameter and an amplitude modulation parameter. The frequency modulator generates a frequency modulation signal and the correlation signal. The amplitude modulator receives the amplitude modulation parameter and generates an amplitude modulation signal. The adder receives the frequency tuning parameter and the frequency modulation signal and generates a control signal.

In some implementations, the system further includes a DC feedback circuit that receives the input signal and generates a DC compensation signal. In some implementations, the adder is a first adder and the system further includes a temperature sensor, a temperature compensation circuit, and a second adder. The temperature sensor measures a system temperature and provides it to the temperature compensation circuit, which generates a temperature compensation signal. The second adder receives the temperature compensation signal and the frequency tuning parameter and generates a modified frequency tuning parameter, which is provided to the first adder.

The system includes a molecular clock in some implementations, which includes a frequency signal generator, a transmitter, a physics cell, a receiver, and an analog-to-digital converter (ADC). The frequency signal generator receives the control signal from the adder and generates a frequency-modulated transmit frequency signal. The transmitter receives the frequency-modulated transmit frequency signal and an amplitude modulation signal and generates an amplitude-modulated and frequency-modulated transmit frequency signal. The physics cell receives the amplitude-modulated and frequency-modulated transmit frequency signal and generates an absorption signal. The receiver receives the absorption signal and generates a received signal, and the ADC converts the received signal into the input signal.

In some implementations, the adder is a first adder, and the system further includes a DC feedback circuit that receives the input signal and generates a DC compensation signal. The molecular clock further comprises a second adder that subtracts the DC compensation signal from the received signal to obtain a difference signal. The ADC converts the difference signal into the input signal. In some implementations, an anti-aliasing filter filters the difference signal before the ADC converts it into the input signal.

In some implementations, the digital processing circuit includes two correlators and two filters. The first correlator receives the input signal and generates a first correlation output. The first filter filters the first correlation output to obtain the frequency tuning parameter. The second correlator receives the first correlation output and a correlation signal and generates a second correlation output. The second filter filters the second correlation output to obtain the amplitude modulation parameter.

BRIEF DESCRIPTION OF THE DRAWINGS

FIG. 1A shows a block diagram of an example molecular clock that includes the presence of bias.

FIG. 6B shows a graph of the basis_bias(t) signal in the example bias correction circuit shown in FIG. 6A.

FIG. 8B shows graphs of the gated and ungated receiver output signals generated in the example bias correction circuit shown in FIG. 8A.

DETAILED DESCRIPTION

Figure 1B:
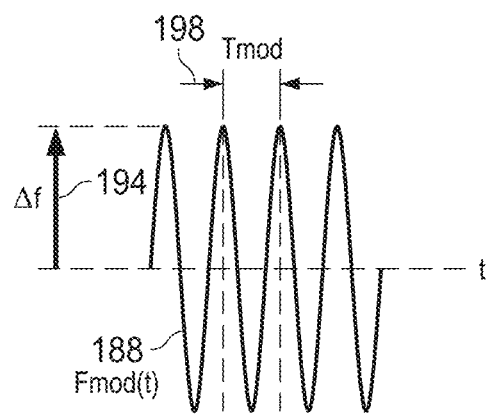
FIG. 1B shows a graph of a frequency-modulated signal generated in the example molecular clock shown in FIG. 1A.

The same reference number is used in the drawings for the same or similar (either by function and/or structure) features.

The described bias correction circuit utilizes both frequency and amplitude modulation to compensate for the impact of process, voltage, and temperature (PVT) variations on bias (also known as "tilt") in the physics cell. The bias correction circuit includes a digital processing circuit, a frequency modulator, an amplitude modulator, and an adder.

The digital processing circuit generates a frequency modulation (FM) waveform and an amplitude modulation (AM) waveform that is similar to the FM waveform, but altered according to amplitude and phase modulation parameters. To compute the amplitude and phase modulation parameters in either continuous or duty cycled modes of operation, the digital processing circuit performs correlations between the received output of the physics cell and components of the frequency modulation signal, such as quadrature sine wave signals at odd and even harmonics of the modulation frequency Fmod and a modulation index signal at the bias frequency Fbias. In some implementations, the digital processor performs odd harmonic correlations with only the fundamental frequency Fmod or only a selected higher order, odd harmonic such as the third harmonic, three times Fmod. In some implementations, the digital processing circuit performs even harmonic correlations to achieve proper phase alignment for the odd harmonic correlations. In some implementations, the digital processor performs even harmonic correlations with only the second harmonic, two times Fmod, or only a selected higher order, even harmonic such as the fourth harmonic, four times Fmod.

The digital processing circuit also uses the correlations to calculate a frequency tuning signal that corrects frequency errors between the average frequency of the RF signal input to the physics cell and the spectral line of the physics cell itself. The frequency tuning signal is added to the frequency modulation signal, such that the instantaneous frequency of the RF signal input to the physics cell is responsive to both FM modulation and frequency correction. In some implementations, the digital processing circuit includes a first correlator and filter for generating the frequency tuning signal, a second correlator and filter for generating an amplitude modulation scale factor tuning parameter, and a third correlator and filter for generating an amplitude modulation phase tuning parameter.

FIG. 1A shows a block diagram of a conventional molecular clock 100 that is impacted by bias. The molecular clock 100 includes frequency signal generator 110, a transmitter 120, a physics cell 130, a receiver 150, a correlator 165, a filter 170, a frequency modulator 180, and an adder 190. The frequency signal generator 110 includes a timing core 112, a fractional-N synthesizer 116, and a multiplier 118. The timing core 112 may be a bulk acoustic wave oscillator, a quartz crystal oscillator, an ovenized crystal oscillator, a temperature compensated oscillator, or the like, and generates a reference frequency signal Fref 114, which is provided to the fractional-N synthesizer 116. The fractional-N synthesizer 116 also receives the output of the adder 190 and multiplies Fref 114 based on the output of the adder 190. In some embodiments, the resulting signal is output as the output clock signal Fout 115. The multiplier 118 receives the resulting signal from the fractional-N synthesizer 116, further multiplies it, and provides the multiplied signal to the transmitter 120 which creates an RF signal.

The output of the transmitter 120 is coupled to the physics cell 130. The physics cell 130 can be a tube or waveguide with a low-pressure dipolar gas that undergoes a quantum rotational transition and absorbs an interrogating electromagnetic RF signal at a specific frequency. The output signal Fout 115 can be made to track the absorption line of the gas, indicated as the frequency fnotch 135, by adjusting the average frequency of the RF signal such that it aligns with the absorption line. The range $2\Gamma$ 145 of the absorbed frequencies influences the choice of modulation depth for FM of the RF signal from the transmitter 120. The physics cell 130 is modeled with a bias transfer function Hbias(f) 124 and an absorption transfer function Hnotch(f) 128. The bias transfer function Hbias(f) 124 represents the bias 140 introduced into the absorption transfer function Hnotch(f) 128 by reflections in the physics cell 130 and/or the FM to AM conversion of the transmitter 120. The bias 140 leads to a frequency-dependent variation of the amplitude of Hnotch (f) 128 that breaks the even symmetry around the frequency fnotch 135 that is generally offered by Hnotch(f) 128 itself.

The output of the physics cell 130 is provided to the receiver 150, which is represented as a detector 154 and a low-pass filter 158 with a transfer function H_LP(f). The received signal Vdet(t) 160 is provided to the correlator 165, which correlates it with the fundamental or higher order odd harmonic of the frequency-modulated signal Fmod 188 provided by the frequency modulator 180. The frequency-modulated signal Fmod 188 is shown in FIG. 1B and can be represented as:

$$F\mathrm{mod}\,188 = (\Delta f\,194)\cdot\sin\left(\frac{2\pi t}{T\mathrm{mod}\,198}\right)$$

where Δf 194 represents the FM index and Tmod 198 represents the period of Fmod 188.

The fundamental or higher order odd harmonic is labeled as Fcorr 184, and in some embodiments, is represented as:

$$F\mathrm{corr}\,184 = \sin\left(\frac{2\pi Nt}{T\mathrm{mod}\,198}\right) + \Phi_{align})$$

where N is equal to 1 for the fundamental and greater than or equal to 3 and odd for a higher order odd harmonic, and $\Phi_{align}$ represents a phase offset. By utilizing a higher order odd harmonic rather than the fundamental for Fcorr 184, the correlation between Vdet(t) 160 and Fcorr 184 is reduced in sensitivity to bias 140. However, correlating to the higher order odd harmonic of Fmod 188 reduces the signal-to-noise ratio (SNR) of the molecular clock relative to correlating to the fundamental of Fmod 188, which may lead to higher noise-induced Allan deviation. In addition, bias sensitivity is only reduced, not eliminated, and can impact the frequency accuracy of Fout 115 and Allan deviation.

The filter 170, which may include one or more accumulators and may also include lowpass filtering, is coupled to the output of the correlator 165 and generates the tuning signal Ftune 175. The frequency modulator 180 also generates the frequency-modulated signal Fmod 188, which the adder 190 combines with the tuning signal Ftune 175. The output of the adder 190 is provided to the fractional-N synthesizer 116, as described previously herein with respect to the frequency signal generator 110.

Figure 2A:
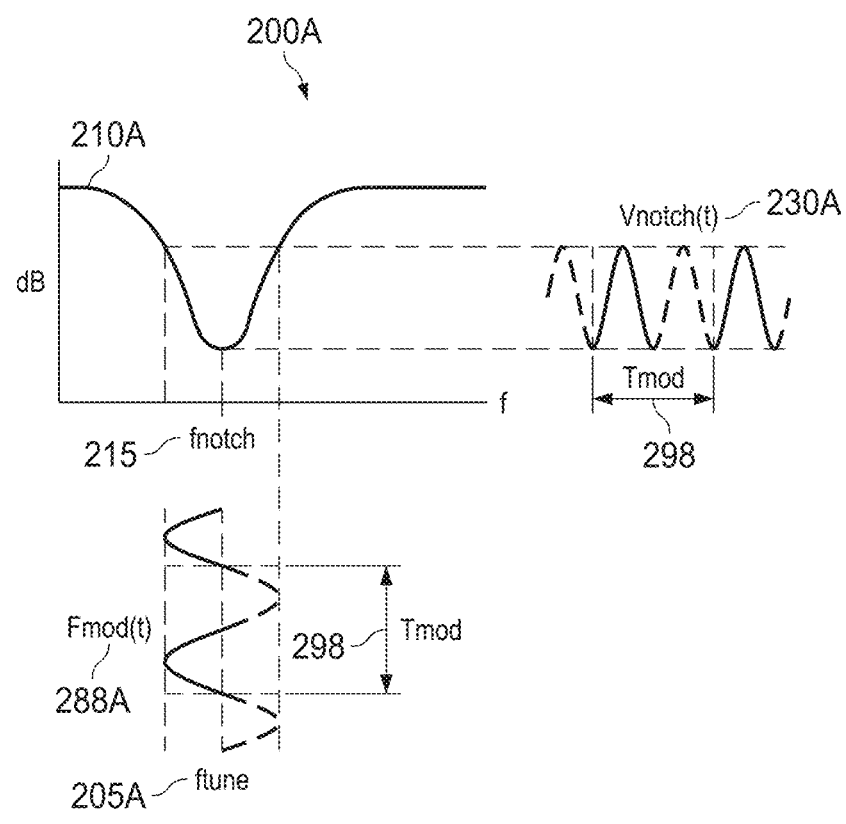
FIG. 2A shows a graph of the transfer function of the physics cell included in the molecular clock shown in FIG. 1A.
Figure 2B:
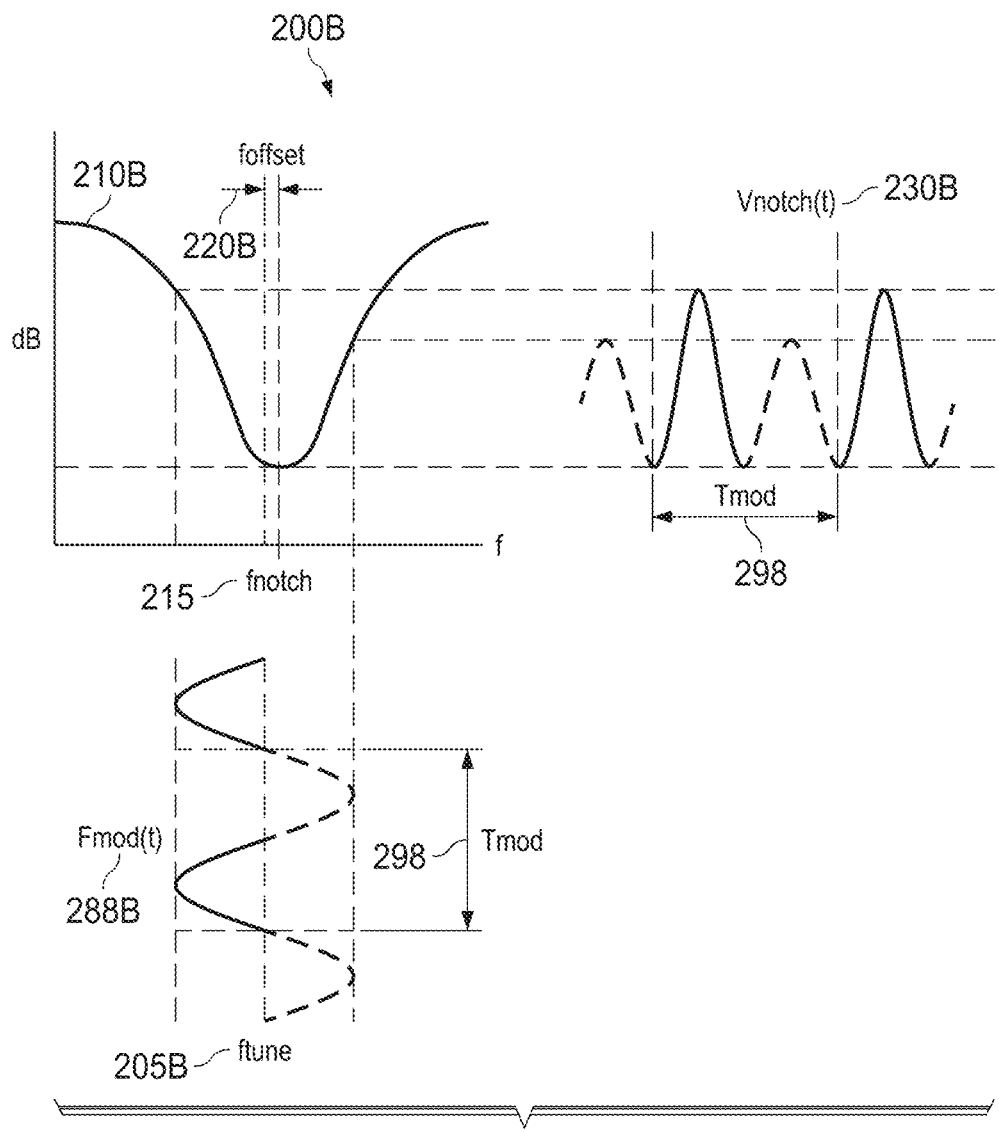
FIGS. 2B-C show graphs of the transfer function of the physics cell included in the molecular clock shown in FIG. 1A and the response to a misalignment between the tuning frequency and the absorption frequency of the physics cell.
Figure 2C:
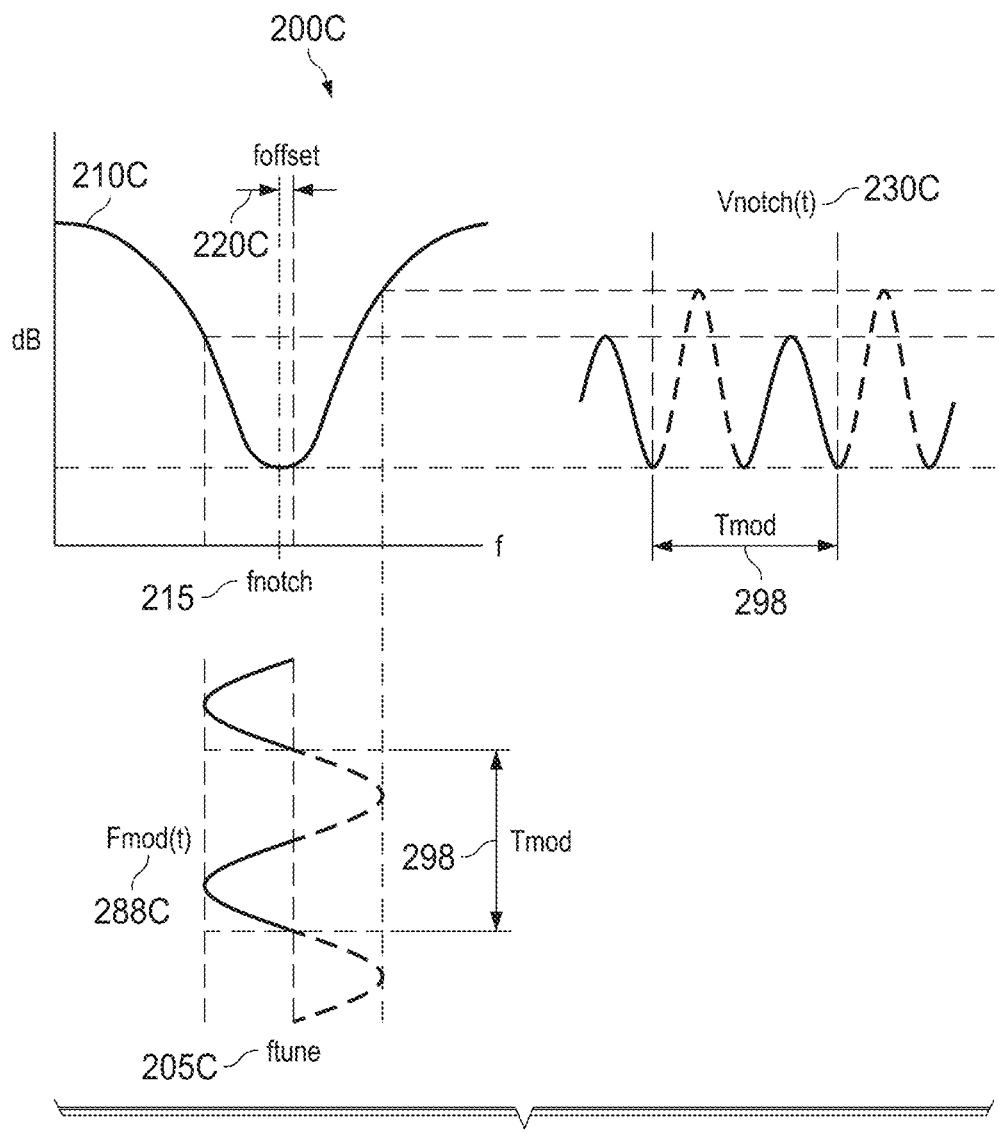

FIGS. 2A-D show graphs of the frequency-modulated signal Fmod(t) 288, the transfer function Hnotch(f) 210 of the physics cell 130, and the output signal Vnotch(t) 230 of the physics cell 130 included in the molecular clock 100 shown in FIG. 1A. Fmod(t) 288 has a period Tmod 298 and an average frequency corresponding to tuning frequency ftune 205. The transfer function Hnotch(f) 210 has an absorption frequency fnotch 215. In FIG. 2A, graph 200A shows the transfer function Hnotch(f) 210A of the physics cell 130 without bias 140 and perfect alignment between ftune 205A of Fmod(t) 288A and fnotch 215 of Hnotch(f) 210A. With perfect alignment between ftune 205A and fnotch 215 and assuming symmetry of Hnotch(f) 210A about fnotch 215, the output signal Vnotch(t) 230A includes only even harmonics. In practice, ftune 205 is sensitive to changes in response to process, voltage, and temperature (PVT) variations which leads to challenges in maintaining alignment of ftune 205 and fnotch 215. Assuming no bias is present, the results of misalignment between ftune 205 and fnotch 215 are shown in FIGS. 2B-C.

In FIG. 2B, graph 200B shows Fmod(t) 288B, Hnotch(f) 210B, and the resulting Vnotch(t) 230B with ftune 205B less than fnotch 215. The difference between ftune 205B and fnotch 215 is represented as foffset 220B. In FIG. 2C, graph 200C shows Fmod(t) 288C, Hnotch(f) 210C, and the resulting Vnotch(t) 230C with ftune 205C greater than fnotch 215. The difference between ftune 205C and fnotch 215 is represented as foffset 220C. The frequency differences foffset 220B and 220C introduce amplitude modulation into Vnotch(t) 230B and Vnotch(t) 230C, respectively. Correlation of Vnotch(t) 230B with the fundamental or an odd harmonic of Fmod(t) 288B and the correlation of Vnotch(t) 230C with the fundamental or an odd harmonic of Fmod(t) 288C provides an error signal.

Figure 2D:
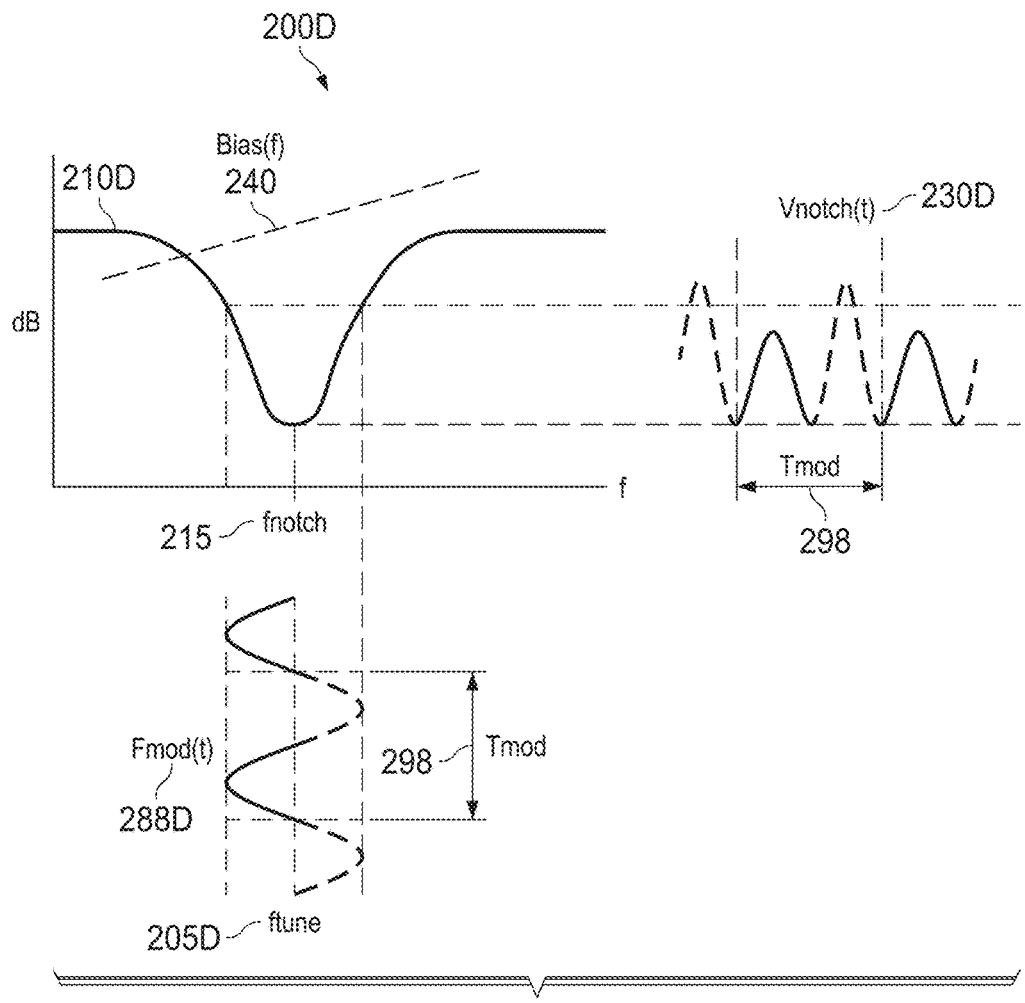
FIG. 2D shows a graph of the transfer function of the physics cell included in the molecular clock shown in FIG. 1A accompanied by bias caused by reflections in the molecular clock and/or FM to AM conversion in the transmitter.

In FIG. 2D, graph 200D shows Fmod(t) 288D, Hnotch(f) 210D, and the resulting Vnotch(t) 230D with perfect alignment between ftune 205B and fnotch 215 but with bias 140 introducing a frequency-dependent variation in the amplitude of Hnotch(f) 210D. Bias 140 introduces amplitude modulation with odd harmonic content into Vnotch(t) 230D even with perfect alignment between ftune 205B and fnotch 215 such that foffset is zero.

Figure 3B:
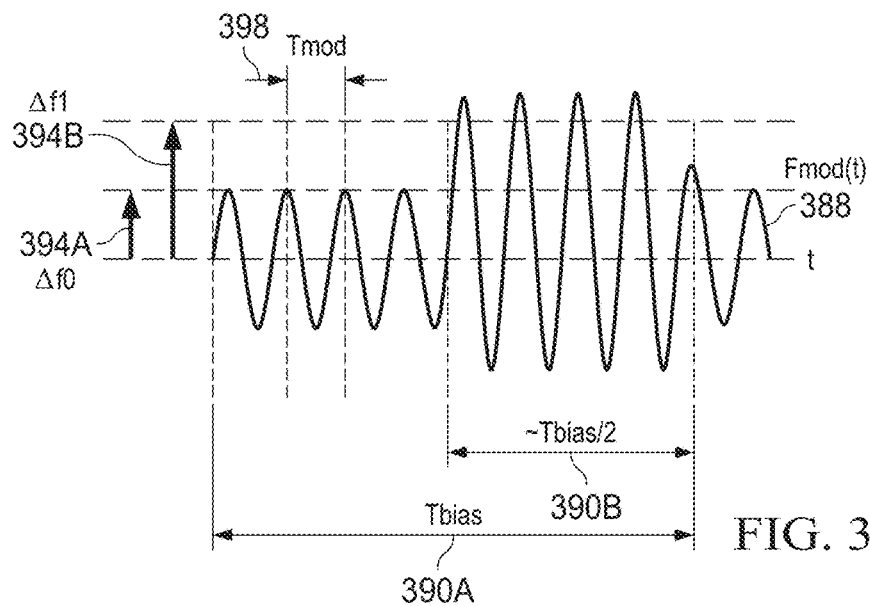
FIG. 3B shows a graph of the frequency-modulated signal generated in the example bias correction circuit shown in FIG. 3A.
Figure 3A:
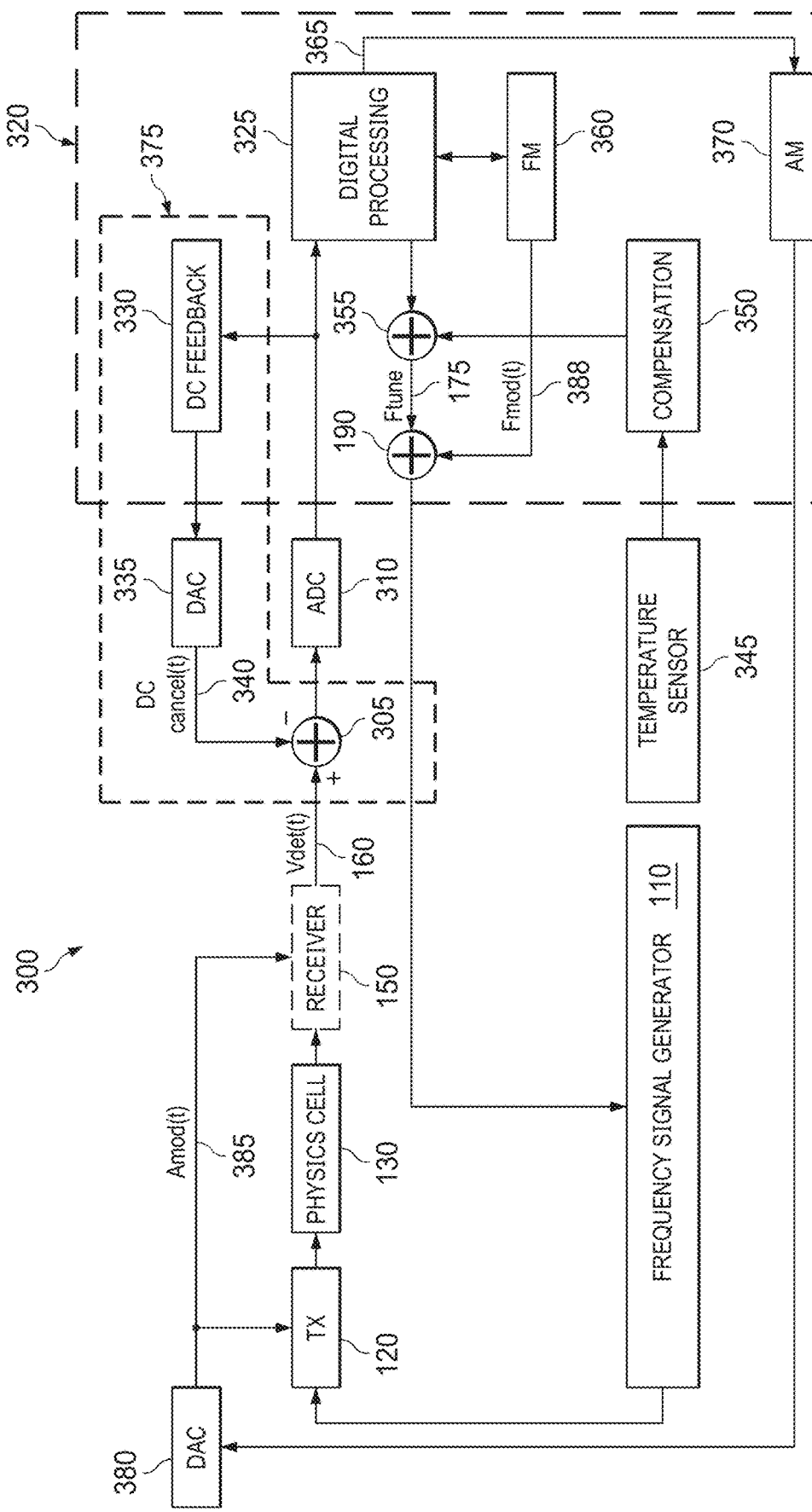
FIG. 3A shows a block diagram of an example bias correction circuit that utilizes both frequency and amplitude modulation.

FIG. 3A shows a block diagram of an example bias correction circuit 300 which incorporates both frequency and amplitude modulation. The bias correction circuit 300 includes the frequency signal generator 110, the transmitter 120, the physics cell 130, the receiver 150, and the adder 190 described herein with respect to the molecular clock 100 shown in FIG. 1A, as well as the adder 305, the analog-to-digital converter (ADC) 310, digital-to-analog converters (DACs) 335 and 380, a correction circuit 320, and an optional temperature sensor 345. The correction circuit 320 includes a digital processing circuit 325, a DC feedback circuit 330, a frequency modulator 360, and an amplitude modulator 370.

The adder 305, DC feedback circuit 330, and DAC 335 form a DC feedback loop 375. In implementations including the optional temperature sensor 345, the correction circuit 320 also includes a compensation circuit 350 and an adder 355. In some embodiments, DAC 335 may implemented within the receiver 150, for example explicitly with a DAC circuit or implicitly with digital voltage or current control using a selectable resistor array or other digital bias control within the implementation of receiver 150. In addition, in some embodiments, DAC 380 may implemented within the transmitter 120, for example explicitly with a DAC circuit or implicitly with digital voltage or current control using a selectable resistor array or other digital bias control within the implementation of transmitter 120.

The receiver output Vdet(t) 160 is provided to the adder 305, which combines it with the DC correction signal DCcancel(t) 340. The adder 305 can be implemented in the analog domain using appropriate circuits such as opamps and passive elements (including resistors and capacitors) or controlled current or voltage sources to adjust the DC bias of the detector. The ADC 310 is coupled to the output of the adder 305, and the digital processing circuit 325 and the DC feedback circuit 330 in the correction circuit 320 are coupled to the output of the ADC 320. The DC feedback circuit 330 determines the DC bias at a particular frequency modulation index and generates a digital DC correction signal that is converted to the analog DCcancel(t) 340 by the DAC 335 and provided to a negative input of the adder 305 in order to maintain the ADC input within its valid operating range.

In embodiments without the optional temperature sensor 345, compensation circuit 350, and the adder 355, the digital processing circuit 325 generates the tuning signal Ftune 175 directly. In implementations including the optional temperature sensor 345, compensation circuit 350, and the adder 355, the temperature sensor 345 provides the temperature information to compensation circuit 350. The temperature compensation circuit 350 generates a temperature compensation signal, and the digital processing circuit 325 generates a residual frequency tuning signal to compensate for residual error after temperature compensation by utilizing tracking of the spectral line of the physics cell 130. The temperature compensation signal and the residual frequency tuning signal are combined by adder 355 to generate the tuning signal Ftune 175.

The digital processing circuit 325 also generates control signals for frequency modulator 360, which generates the FM signal Fmod(t) 388 shown in FIG. 3B. Fmod(t) 388 has a period Tmod 398 and alternates between a first frequency modulation index Δf0 394A and a second frequency modulation index Δf1 394B. The frequency modulator 360 generates Fmod(t) 388 such that alternation between first modulation index Δf0 394A and second modulation index Δf1 394B occurs with a period Tbias 390A, with Δf0 394A being utilized for approximately half of Tbias 390B and at Δf1 394B being utilized for approximately half of Tbias 390B. In some applications, the duty cycle of alternating between Δf0 and Δf1 can be altered away from precisely half of Tbias 390A for improved system performance. The adder 190 combines Ftune 175 and Fmod(t) 388 and provides the result to the fractional-N synthesizer 116 in the frequency signal generator 110.

Figure 3C:
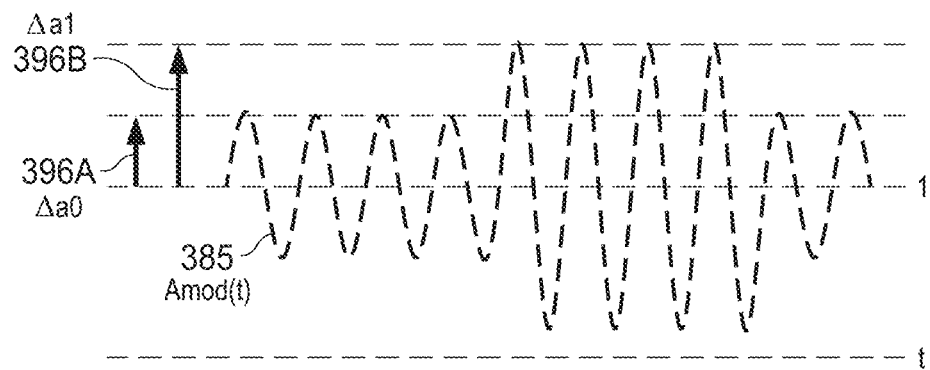
FIG. 3C shows a graph of the amplitude-modulated signal generated in the example bias correction circuit shown in FIG. 3A.

The digital processing circuit 325 also provides amplitude modulation parameters 365 for amplitude modulator 370. The amplitude modulation parameters 365 can include an amplitude scaling factor Atune, a phase parameter (tune, or both for polar amplitude modulation or an in-phase (I) parameter $\Phi_{tune}$, a quadrature (Q) parameter Qtune, or both for I/Q amplitude modulation. The amplitude modulator 370 generates a digital amplitude modulation signal that is converted to the analog amplitude modulation signal Amod (t) 385 shown in FIG. 3C by the DAC 380. Amod(t) 385 alternates between a first amplitude modulation index Δa0 396A and a second amplitude modulation index Δa1 396B with period Tbias. The amplitude modulation signal Amod (t) 385 can be provided to the transmitter 120 for transmitter-based FM to AM bias correction or to the receiver 150 for receiver-based bias correction. In some implementations, transmitter-based FM to AM bias correction is used because it desensitizes the bias correction to nonlinearities in the signal path from TX 120 to RX 150.

For transmitter-based FM to AM bias correction and assuming the multiplication of the transmitter bias correction and the bias 140 is flat in frequency, Vdet(t) 160 will include only even harmonics despite the presence of nonlinearities in voltage or current in the receiver 150, such that correlation to odd harmonics (including the fundamental) will be zero in response to the tuning frequency ftune being equal to fnotch 135. For receiver-based bias correction and assuming the multiplication of the receiver bias correction and the bias 140 is flat in frequency, Vdet(t) 160 may still include odd harmonics because of the presence of nonlinearities in voltage or current in the receiver 150, such that correlation to odd harmonics (including the fundamental) may not be zero in response to the tuning frequency ftune being equal to fnotch 135.

Thus, in implementations in which Amod(t) 385 is provided to the receiver 150, the receiver 150 may be chosen to have a higher linearity than in implementations in which Amod(t) 385 is provided to the transmitter 120. The bias correction circuit 300 uses both frequency modulation with varying frequency modulation indices and amplitude modulation to track the absorption frequency fnotch 135 in the presence of bias 140. The tuning signal Ftune 175 and the amplitude modulation parameters 365 can be updated to maintain accuracy across PVT variations.

FIGS. 4A-D show block diagrams of example molecular clocks including the example bias correction circuit 300 shown in FIG. 3A. For ease of explanation, FIGS. 4A-E are described herein with reference to FIG. 3A. As discussed previously herein with respect to FIG. 3A, the DACs 335 and 380 may be incorporated within the receiver 150 and the transmitter 120, respectively, for example explicitly with a DAC circuit or implicitly with digital voltage or current control using a selectable resistor array or other digital bias control.

Figure 4E:
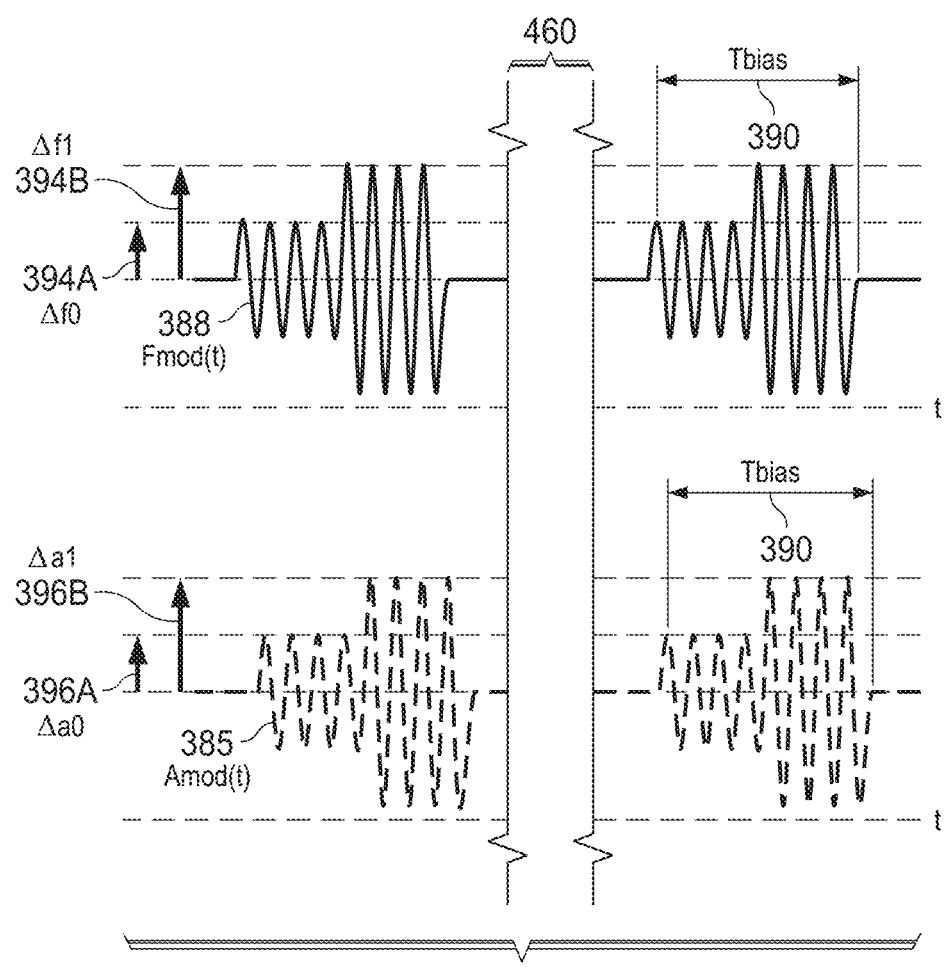
FIG. 4E shows graphs of duty-cycled signals generated in the molecular clocks shown in FIGS. 4A-D.
Figure 4A:
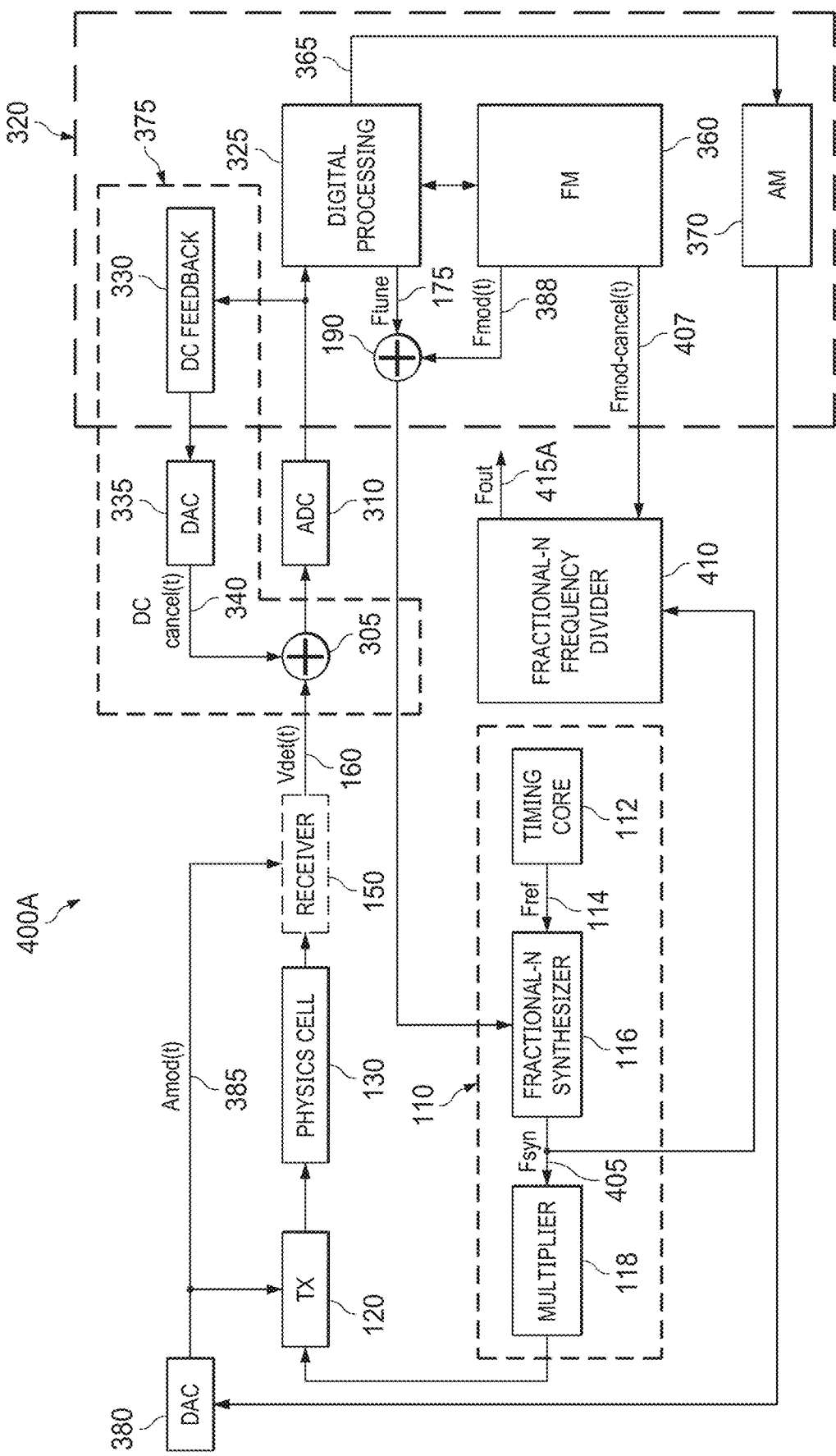
FIGS. 4A-D show block diagrams of example molecular clocks including the example bias correction circuit shown in FIG. 3A.

In FIG. 4A, the molecular clock 400A includes the bias correction circuit 300 and a fractional-N frequency divider 410. The output Fsyn 405 of the fractional-N synthesizer 116 in the frequency signal generator 110 is locked to fnotch 135, and the fractional-N frequency divider 410 uses a frequency modulation cancellation signal Fmod_cancel(t) 407 from frequency modulator 360 to cancel out undesirable frequency modulation in Fsyn 405 and generates the output clock signal Fout 415A. Dithering noise due to dynamic divide value variations from the fractional-N frequency divider 410 can be reduced by including a digital-to-time converter to cancel the dithering noise and achieve low jitter in Fout 415A. Multiple fractional-N frequency dividers can be utilized, each with respective Fmod-cancel(t) signals, in order to produce one or more output frequencies in addition to Fout 415A. Temperature compensation as shown in FIG. 3A can be utilized by adding the temperature compensation signal to Ftune 175 such that Ftune 175 represents a residual frequency tuning signal.

Figure 4B:
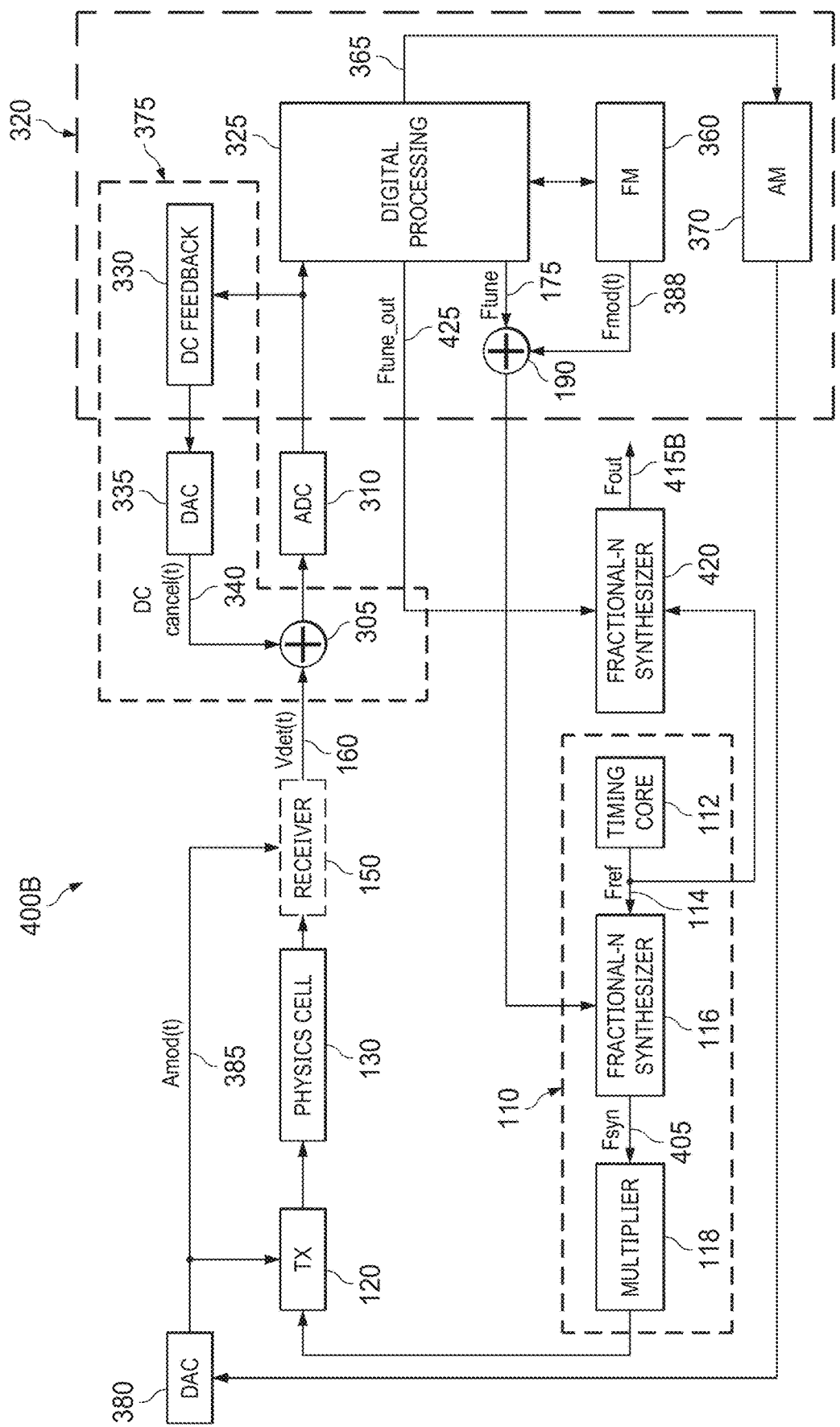

In FIG. 4B, the molecular clock 400B includes the bias correction circuit 300 and a fractional-N synthesizer 420. The fractional-N synthesizer 420 receives the reference frequency signal Fref 114 output by timing core 112 in the frequency signal generator 110 and a second tuning signal Ftune_out 425 from the digital processing circuit 325. Ftune_out 425 is a function of Ftune 175. For example, Ftune_out 425 can be represented as:

$$\text{Ftune\_out } 425 = (\alpha)(\text{Ftune } 175) + b$$

where a and b are constants chosen based on Fref 114, Fsyn 405, and the desired output clock signal Fout 415B. The fractional-N synthesizer 420 then generates the output clock signal Fout 415B. The molecular clock 400B provides a straightforward means of avoiding the impact of the FM modulation signal Fmod(t) 388 on Fout 412B compared to requiring Fmod cancellation as utilized in the molecular clock 400A shown in FIG. 4A. The molecular clock 400B can be combined with one or more frequency divider circuits to produce multiple output frequencies based on Fout 415B. Temperature compensation as shown in FIG. 3A can be utilized by adding a first temperature compensation signal to Ftune 175 such that Ftune 175 represents a first residual frequency tuning signal and by adding a second temperature compensation signal to Ftune_out 425 such that Ftune_out represents a second residual frequency tuning signal.

Figure 4C:
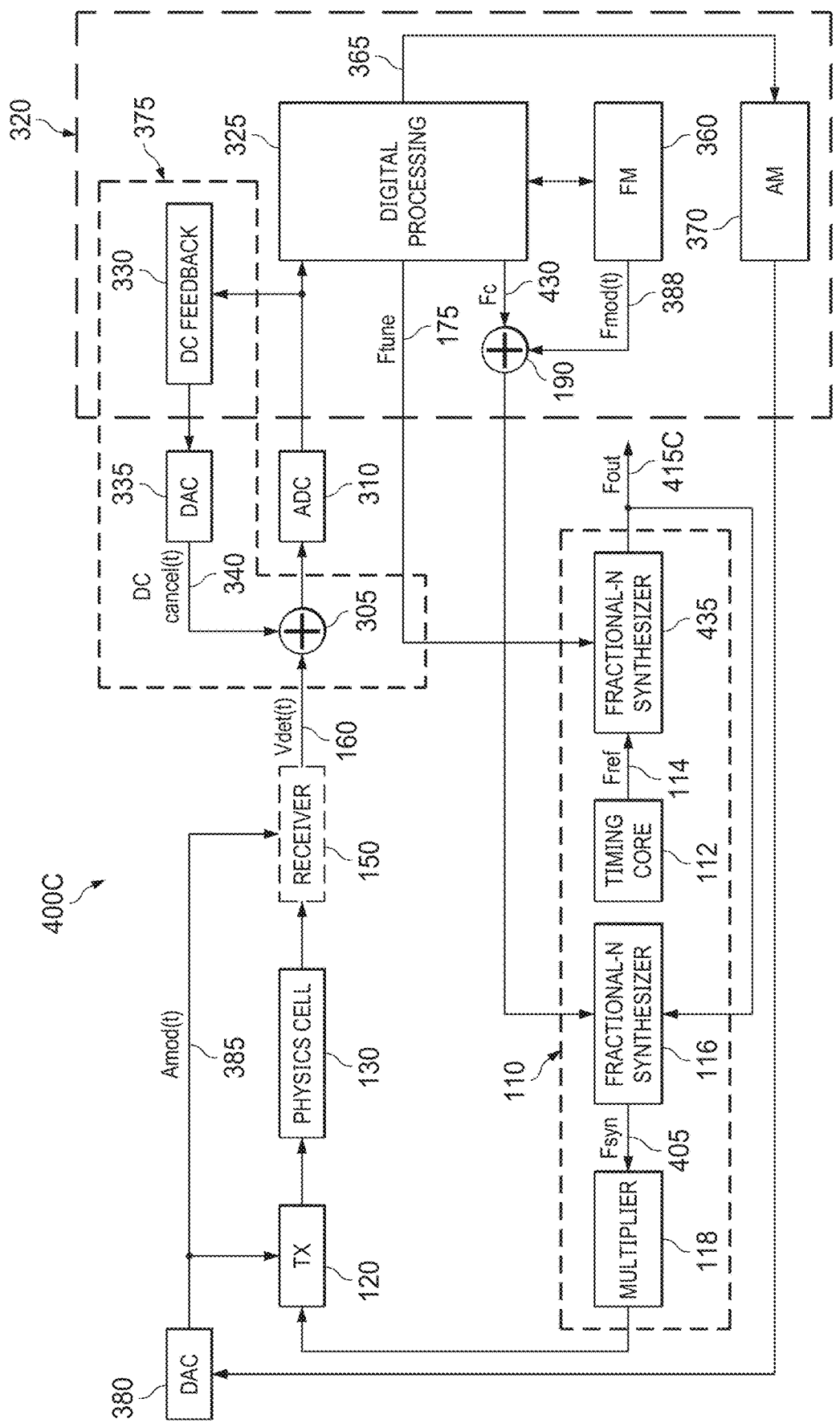

In FIG. 4C, the molecular clock 400C includes the bias correction circuit 300 and the frequency signal generator 110 includes an additional fractional-N synthesizer 435. The fractional-N synthesizer 435 receives the reference frequency signal Fref 114 output by timing core 112 and the tuning signal Ftune 175 from the digital processing circuit 325. The fractional-N synthesizer 435 generates the output clock signal Fout 415C. The digital processing circuit 325 generates a signal Fc 430 and provides it to adder 190, which combines Fc 430 with Fmod(t) 388 from frequency modulator 360. The fractional-N synthesizer 116 in the frequency signal generator 110 receives the output of adder 190 and Fout 415C and generates a synthesized signal Fsyn 405. The signal Fc 430 can be set at a constant frequency value based on a desired frequency of Fsyn 405 relative to Fout 415C. The molecular clock 400B can be combined with one or more frequency divider circuits to produce multiple output frequencies based on Fout 415C. Temperature compensation as shown in FIG. 3A can be utilized by adding the temperature compensation signal to Ftune 175 such that Ftune 175 represents a residual frequency tuning signal.

Figure 4D:
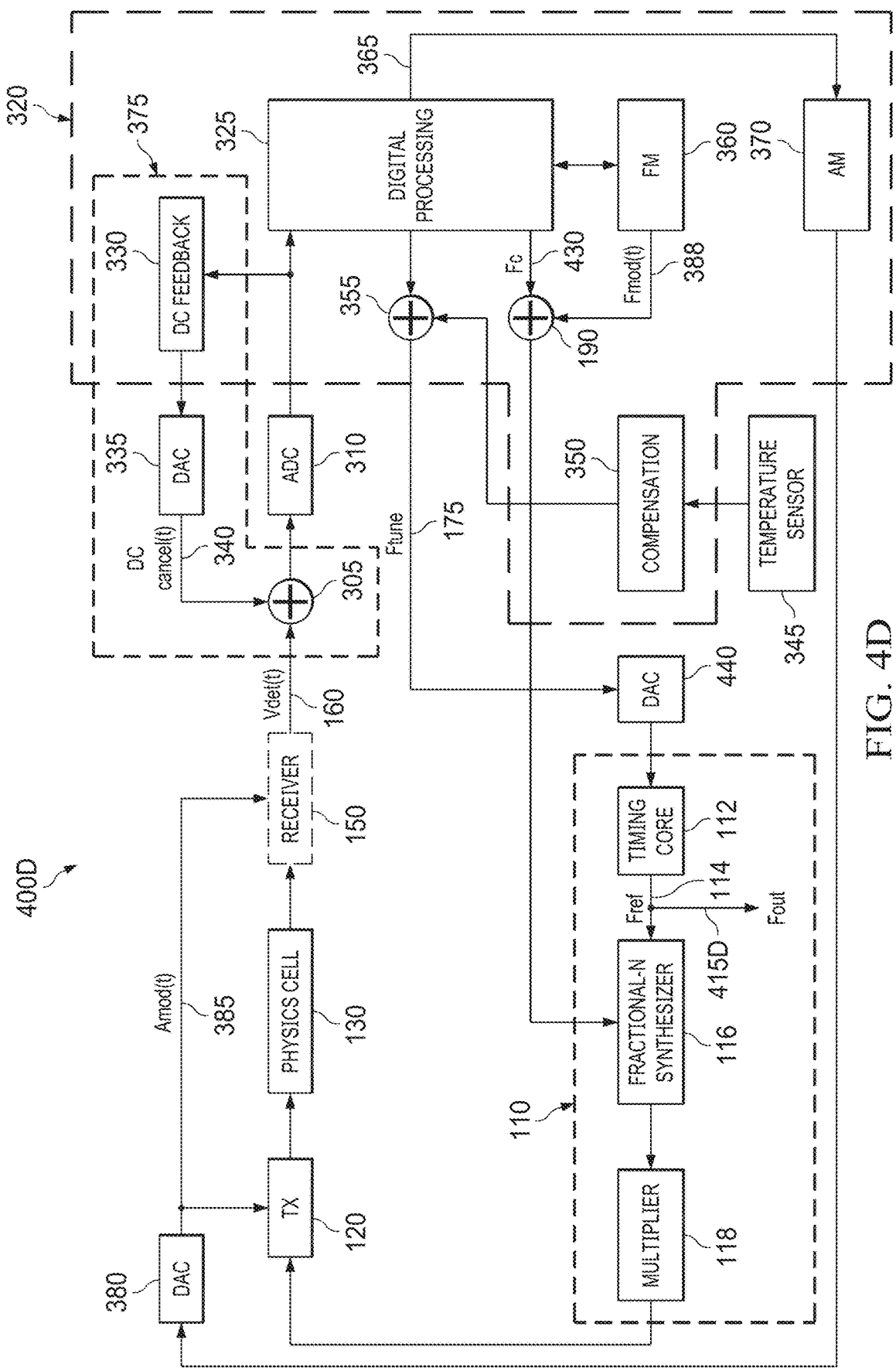

In FIG. 4D, the molecular clock 400D includes the bias correction circuit 300 and a DAC 440, which receives the tuning signal Ftune 175 from the digital processing circuit 325. Analog tuning enables timing core 112 to generate a highly accurate reference frequency signal Fref 114, such that it can be directly output as the clock signal Fout 415D. In some embodiments, the molecular clock 400D includes the optional temperature sensor 345, compensation circuit 350, and the adder 355, and the tuning signal Ftune 175 includes the temperature compensation signal. In some implementations, the DAC 440 may be implemented within the timing core 112, for example explicitly with a DAC circuit or implicitly with digital frequency control using a fractional-N synthesizer or selectable capacitor array within the implementation of timing core 112.

FIG. 4E shows graphs of a duty-cycled Fmod(t) 388 and a duty-cycled Amod(t) 385 generated in the molecular clocks 400 shown in FIGS. 4A-D. Fmod(t) 388 and Amod(t) 385 are duty-cycled in order to save power during the time-periods 460. Frequency correction of the timing core 112 can be performed on a duty-cycled basis to balance the power used by the molecular clocks 400 with an acceptable amount of noise. The timing core 112 and clock signal output path remain on, and the other components of the molecular clocks 400 are turned off or transitioned to a low power mode of operation as appropriate. For example, the transmitter 120, the receiver 150, the ADC 310, the DACs 335 and 380, and adder 305 can be turned off during time periods 460.

Figure 5:
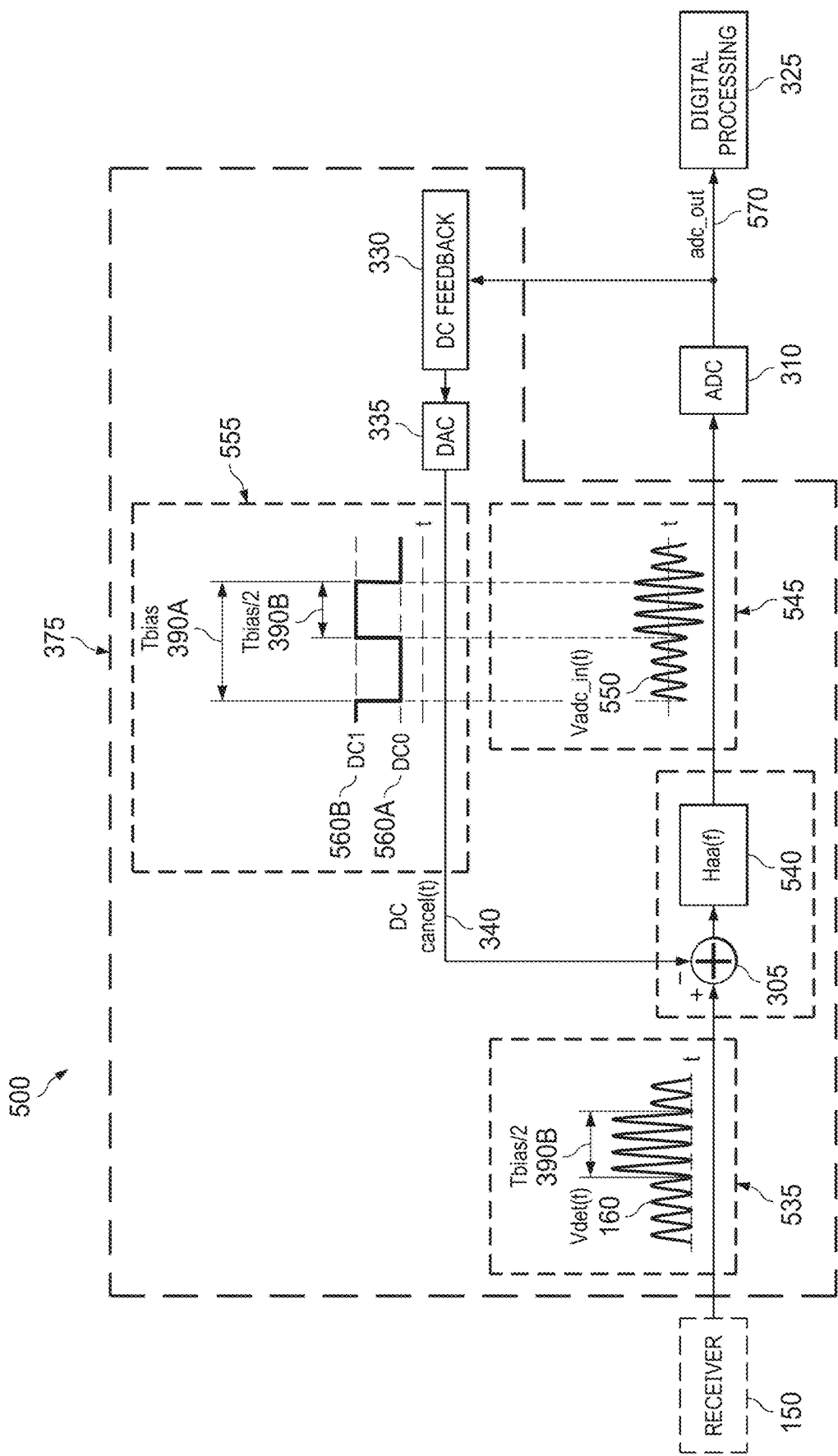
FIG. 5 shows a block diagram of a signal chain in the DC feedback system shown in FIG. 3A.

FIG. 5 shows a block diagram of a signal chain 500 in the DC feedback system 375 shown in FIG. 3A. The receiver 150 outputs the signal Vdet(t) 160, shown in the offset 535. The frequency modulation with time varying FM index of period Tbias 390 leads to amplitude modulation of Vdet(t) with a time varying peak-to-peak amplitude of period Tbias 390. Vdet(t) 160 is input to the positive input of adder 305, and DCcancel(t) 340 is provided to the negative input of adder 305. An anti-aliasing filter 540 represented as Haa(f) is coupled to the output of adder 305. The output of the anti-aliasing filter 540 is Vadc_in(t) 550, shown in offset 545, and is coupled to the input of ADC 310. The output adc_out 570 of ADC 310 is provided to DC feedback circuit 330 and to digital processing circuit 325, not shown.

The DC feedback circuit 330 determines the DC bias at the particular FM index value and generates a digital DC correction signal that is converted to the analog DCcancel(t) 340 by the DAC 335. DCcancel(t) 340 is shown in offset 555 and has a first magnitude DC0 560A for the first FM index Δf0 394A and a second magnitude DC1 560B for the second FM index Δf1 394B. The DC bias depends on the particular FM index, Δf0 394A or Δf1 394B, so separate DC correction values are calculated for each FM index and subtracted before Vdet(t) 160 is input to ADC 310 to reduce transients as Vdet(t) 160 transitions from one FM index to another.

In some implementations where DCcancel(t) 340 is further filtered to remove undesired noise or interference from DAC 335, DC0 560A can be set equal to DC1 560B as long as transients from the anti-aliasing filter Haa(f) 540 from transitions of FM index from one value to another still allow acceptable system performance. As discussed previously herein with respect to FIG. 3A, the DAC 335 may implemented within the receiver 150, for example explicitly with a DAC circuit or implicitly with digital voltage or current control using a selectable resistor array or other digital bias control within the implementation of receiver 150.

Figure 6A:
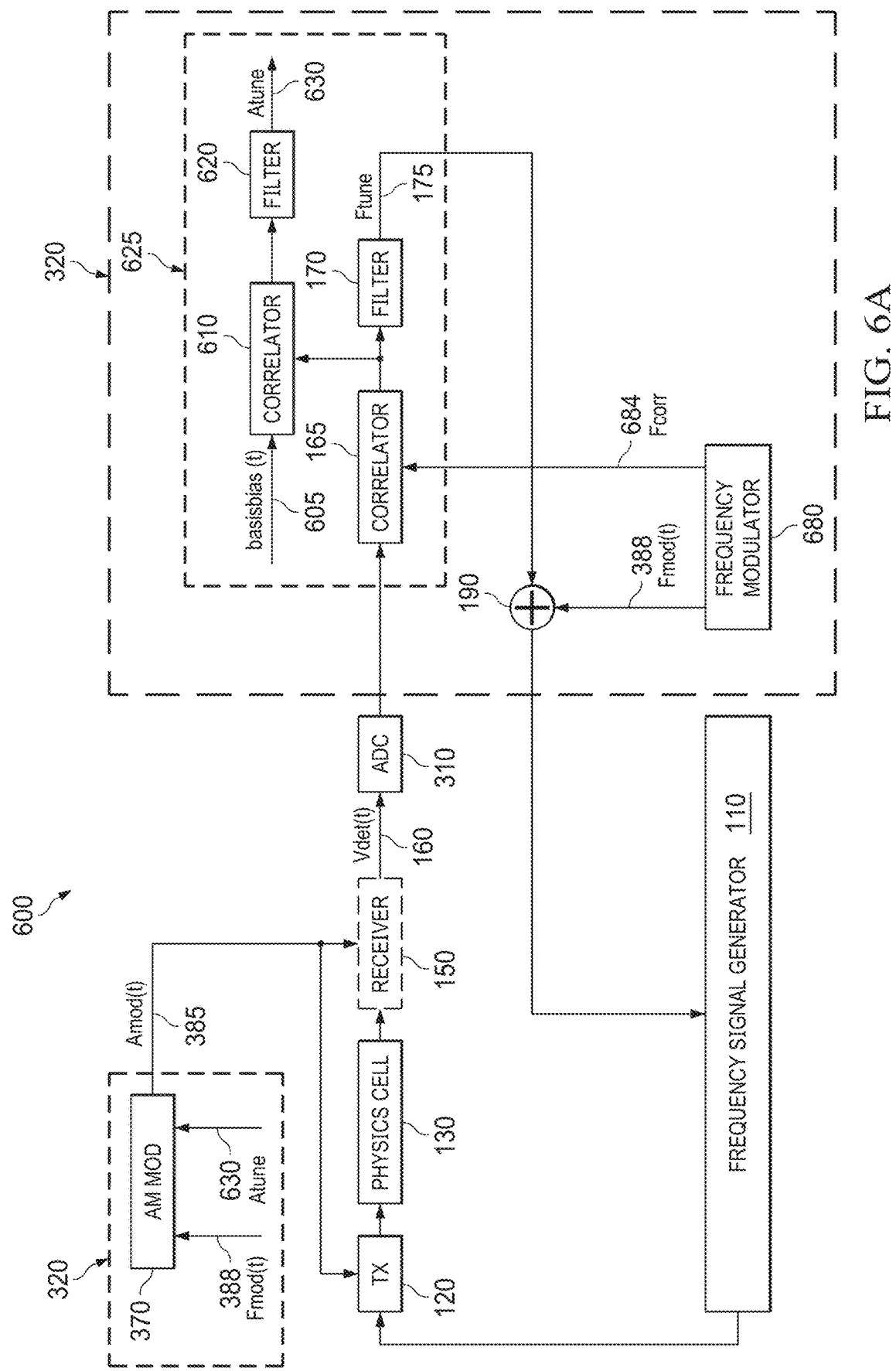
FIG. 6A shows a block diagram of the example bias correction circuit shown in FIG. 3A with continuous tuning of the scaling factor of the amplitude-modulated signal.

FIG. 6A shows a block diagram of an example bias correction circuit 600 with continuous tuning of the scaling factor Atune 630 of the amplitude-modulated signal Amod(t) 385. The bias correction circuit 600 is similar to the bias correction circuit 300 shown in FIG. 3A but includes frequency modulator 680 instead of frequency modulator 360 and a digital processing circuit 625 instead of digital processing circuit 325. The digital processing circuit 625 includes the correlator 165 and filter 170 shown in FIG. 1A and a correlator 610 and a filter 620. For ease of illustration, the optional temperature sensor 345, compensation circuit 350, adder 305, DC feedback circuit 330, and DACs 335 and 380 are omitted.

The correlator 165 receives the output of ADC 310 (which digitizes Vdet(t) 160 from receiver 150) and Fcorr 684 from the frequency modulator 680. Fcorr 684 can be represented as:

$$Fcorr\,684 = \sin\left(\frac{2\pi Nt}{Tmod\,398} + \Phi_{align}\right)$$

Fcorr 684 can use the fundamental of Fmod(t) 388 such that N=1 as well as higher order odd harmonics (N=3,5, . . . ) similar to Fcorr 184 shown in FIG. 1A. The filter 170 accumulates the correlation output from correlator 165 to generate Ftune 175.

The correlator 610 further correlates the correlation output from correlator 165 with the biasing signal basisbias(t) 605, shown in FIG. 6B. Basisbias(t) 605 is a square wave alternating between positive one and negative one in alternate portions of Tbias 390A according to alternation of the FM index between Δf0 394A and Δf1 394B in Fmod(t) 388. While the example basisbias(t) 605 shown in FIG. 6B has an even duty cycle approximately equal to half of Tbias 390B, in some implementations an uneven duty cycle can be used. Filter 620 is coupled to the output of the correlator 610 and accumulates the output of correlator 610 to generate the scaling factor Atune 630. In some implementations, Atune 630 is represented as:

$$Atune\,630 = \frac{\Delta a1\,396B}{\Delta f1\,394B} = \frac{\Delta a0\,396A}{\Delta f0\,394A}$$

Continuous calculation of Atune 630 allows the bias cancellation to remain accurate despite PVT variations. The AM modulator 370 receives Fmod(t) 388 and Atune 630 and generates Amod(t) 385.

Figure 7:
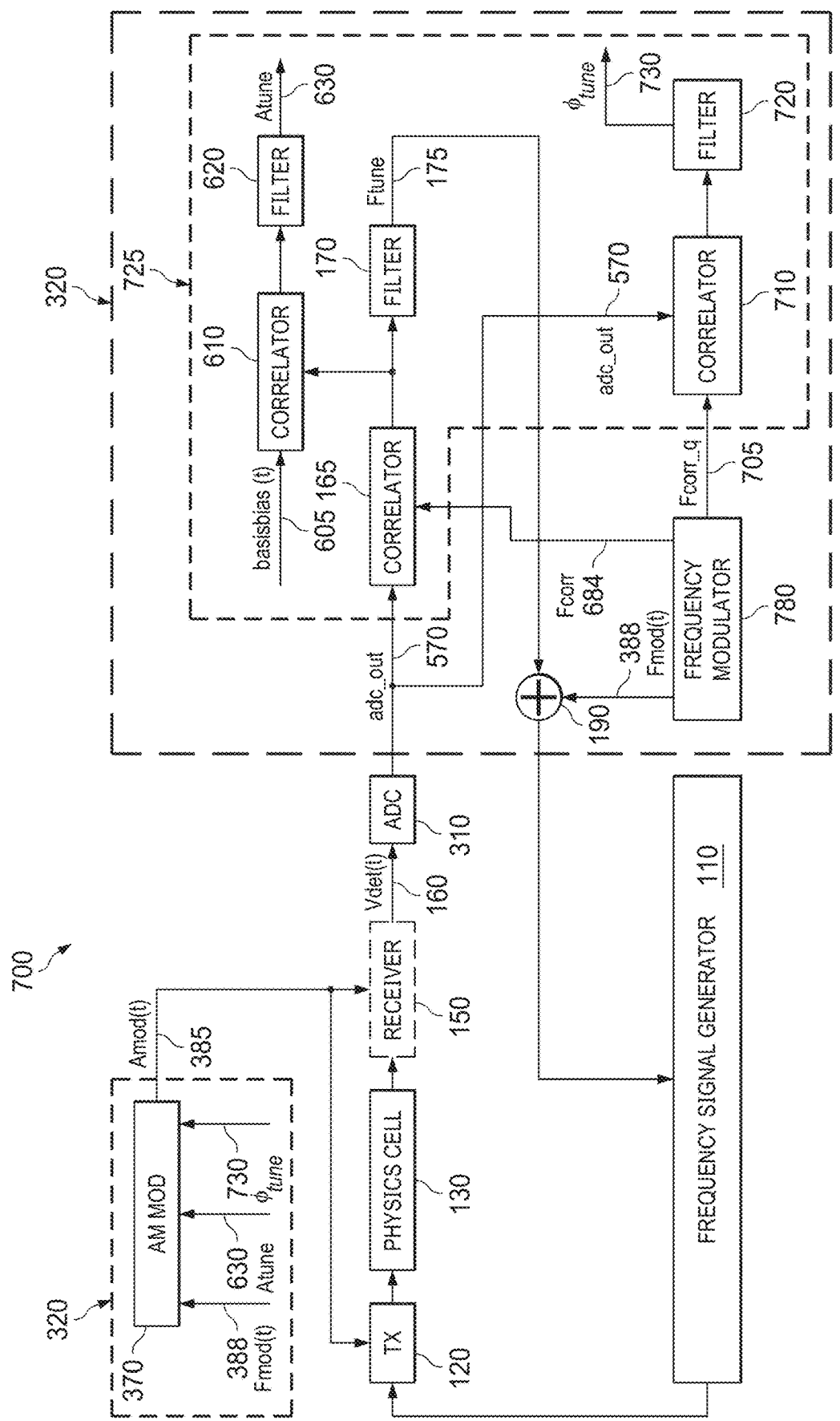
FIG. 7 shows a block diagram of the example bias correction circuit shown in FIG. 6A with continuous tuning of the phase of the amplitude-modulated signal.

Filter delays in the bias correction circuit 600 can create a phase difference between the FM and AM modulation paths and introduce error into the bias correction. FIG. 7 shows a block diagram of an example bias correction circuit 700 with continuous tuning of the phase of the amplitude-modulated signal Amod(t) 385. The bias correction circuit 700 is similar to the bias correction circuit 600 shown in FIG. 6A but includes frequency modulator 780 instead of frequency modulator 680 and digital processing circuit 725 instead of digital processing circuit 625. The digital processing circuit 725 is similar to the digital processing circuit 625, but also includes a correlator 710 and a filter 720. For ease of illustration, the optional temperature sensor 345, compensation circuit 350, adder 305, ADC 310, DC feedback circuit 330, and DACs 335 and 380 are omitted.

The correlator 710 receives adc_out 570 from the output of ADC 310, which digitizes Vdet(t) 160, and Fcorr_q 705 from the frequency modulator 780. Fcorr_q 705 can be represented as:

$$Fcorr\_q\,705 = \sin\left(\frac{2\pi Nt}{Tmod\,398} + \Phi_{align} + \Phi_{quad}\right)$$

where $\Phi_{quad}$ is chosen such that Fcorr_q 705 is 90 degrees phase-shifted relative to Fcorr 684. The filter 720 accumulates the correlation output from correlator 710 to generate $\Phi_{tune}$ 730, which may be calculated independently for each modulation index Δf0 394A and Δf1 394B. In some implementations, $\Phi_{tune}$ 730 adjusts the phase of Amod(t) 385 by utilizing the in-phase and quadrature components of Fmod(t) 388. AM modulator 370 receives Fmod(t) 388, Δtune 630, and $\Phi_{tune}$ 730, and generates Amod(t) 385. Continuous calculation of $\Phi_{tune}$ 730 allows the bias correction circuit 700 to adjust Amod(t) 385 until the correlation of adc_out 570 and Fcorr_q 705 reaches approximately zero.

As discussed previously herein with respect to FIG. 6A, Fcorr 684 can be represented as:

$$F\text{corr}\,684 = \sin\left(\frac{2\pi Nt}{T\text{mod}\,398} + \Phi_{align}\right)$$

Both Fcorr 684 and Fcorr_q 705 include a phase offset term $\Phi_{align}$ PVT variations can introduce error into the phase offset term $\Phi_{align}$ of the correlation signals Fcorr 684 and Fcorr_q 705 which can lead to errors in the calculation of ftune to match fnotch and therefore a non-zero foffset.

Figure 8A:
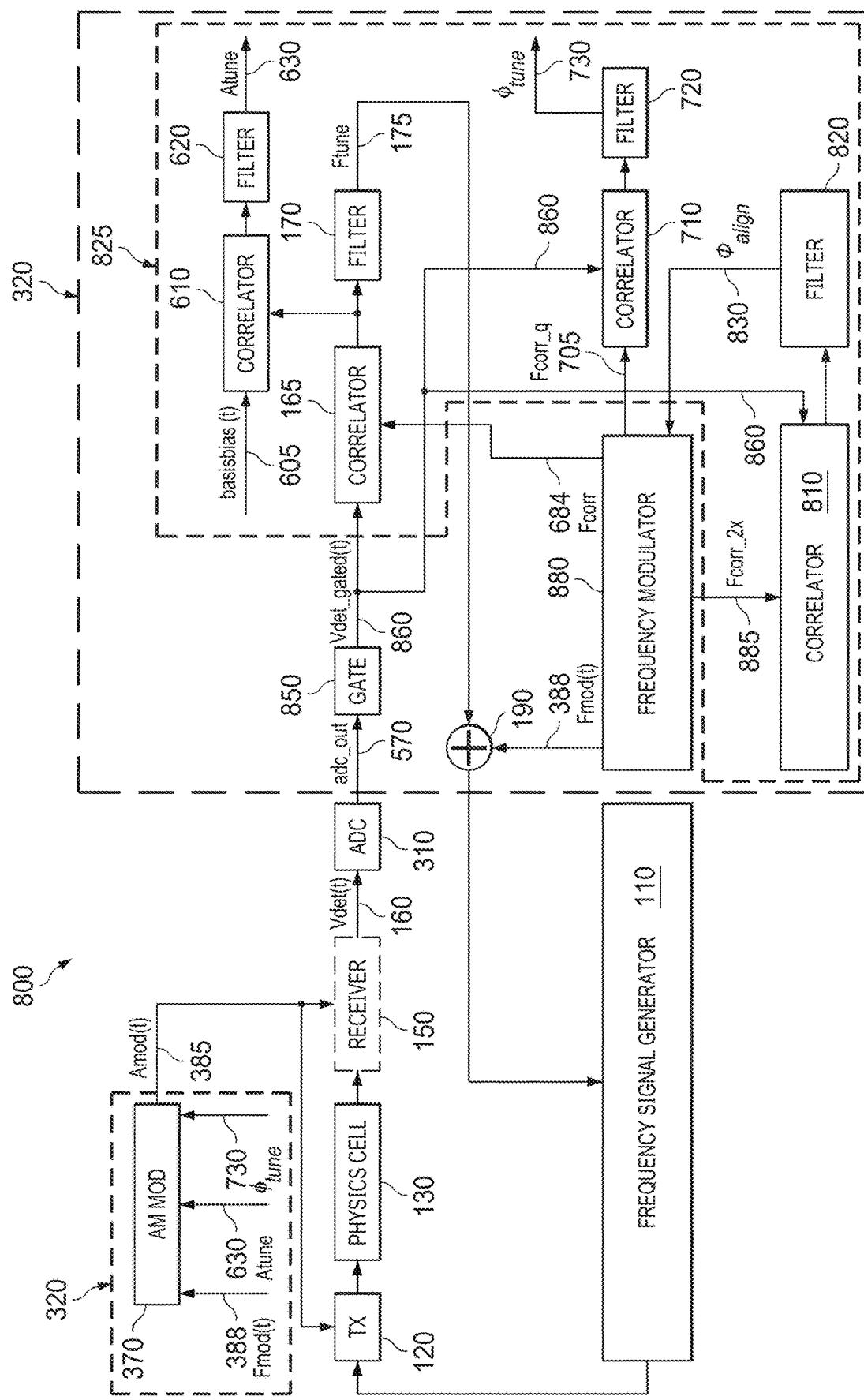
FIG. 8A shows a block diagram of the example bias correction circuit shown in FIG. 7 with continuous tuning of the phase alignment of correlation signals.

FIG. 8A shows a block diagram of an example bias correction circuit 800 that includes continuous tuning of the phase offset term $\Phi_{align}$ of the correlation signals Fcorr 684 and Fcorr_q 705. In addition, FIG. 8A includes a gating circuit 850 that prevents undesired transients from FM index variation from influencing correlation results. While frequency tuning and bias correction drive odd harmonics (including the fundamental) of Fmod(t) 388 toward zero at the gated detector output Vdet_gated(t) 860 during steady state operation, even harmonics of Fmod(t) 388 remain present in Vdet_gated(t) 860 and can be used to calculate the phase offset term $\Phi_{align}$. In this example, bias correction circuit 800 correlates Vdet_gated(t) 860 with the second harmonic of Fmod(t) 388 that has an appropriate phase shift, represented as Fcorr_2x 885, using correlator 810.

Filter 820 accumulates the correlation output of correlator 810 to generate phase offset term $\Phi_{align}$ for proper phase alignment of Fcorr and Forr_q. The phase offset term $\Phi_{align}$ can be adjusted in value until the correlation output of correlator 810 has an average value of zero. The bias correction circuit 800 is similar to the bias correction circuit 700 shown in FIG. 7 but includes an optional gate 850, frequency modulator 880 instead of frequency modulator 780, and digital processing circuit 825 instead of digital processing circuit 725. The digital processing circuit 825 is similar to the digital processing circuit 725, but also includes a correlator 810 and a filter 820. For ease of illustration, the optional temperature sensor 345, compensation circuit 350, adder 305, DC feedback circuit 330, and DACs 335 and 380 are omitted.

Transients can occur in Vdet(t) 160 due to changes in the FM index from Δf0 394A to Δf1 394B and vice versa and introduce error into the correlation calculations performed by correlators 165, 610, 710 and 810. The digitized Vdet(t) 160, adc_out 570, can be gated for a predetermined number of modulation cycles to avoid the impact of transients in the correlation calculations. FIG. 8B shows the ungated digitized Vdet(t) 160 from the output of ADC 310 and the resulting gated Vdet_gated(t) 860, which is set to zero while the FM index changes from Δf0 394A to Δf1 394B at 865A and vice versa at 865B.

The optional gate 850 can be used to generate the gated signal Vdet_gated(t) 860 based on the digitized Vdet(t) 160, adc_out 570, from the output of ADC 310. The correlators 165, 610, 710, and 810 receive the gated signal Vdet_gated (t) 860 from optional gate 850. Alternatively, the correlations output from correlators 165, 610, 710 and 810 can be set to zero during the transitions from Δf0 394A to Δf1 394B at 865A and vice versa at 865B.

Correlator 810 receives the second harmonic basis signal Fcorr_2x 885 and the gated signal Vdet_gated(t) 860. The second harmonic basis signal 885 can be represented as:

$$F\text{corr}\_2x\,885 = \sin\left(\frac{4\pi t}{T\text{mod}\,398} + f(\Phi_{align}) + \Phi_{quad\_2x}\right)$$

where $\Phi_{quad\_2x}$ is chosen such that Fcorr_2x 885 is nominally 90 degrees phase-shifted relative to the second harmonic of Fmod(t) 388 present in Vdet_gated(t) 860. In some implementations, $f(\Phi_{align})$ is equal to two times $\Phi_{align}$ such that adjustments to $\Phi_{align}$ to set the average correlation output from correlator 810 equal to zero will also properly adjust Fcorr 684 and Fcorr_2x 885 in response to PVT variations. In some implementations, the phase adjustment of Fcorr_2x 885 is implemented through in-phase and quadrature (I/Q) based phase shifting that uses the second harmonic basis signals represented as:

$$\sin\left(\frac{4\pi t}{T\text{mod}\,398}\right)$$

and $$\cos\left(\frac{4\pi t}{T\text{mod}\,398}\right)$$

Similarly, phase adjustment of Fcorr 684 and Fcorr_q 705 can be implemented based on (I/Q) based phased shifting that uses fundamental or odd harmonic basis signals represented as:

$$\sin\left(\frac{2\pi Nt}{T\text{mod}\,398}\right)$$

and $$\cos\left(\frac{2\pi Nt}{T\text{mod}\,398}\right)$$

where N is an odd integer greater than or equal to 1 corresponding to the fundamental or given odd harmonic of Fmod(t) 388.

In implementations without the optional gate 850, the correlation of adc_out 570 with the second harmonic basis signal Fcorr_2x 885 is provided to the filter 820. In implementations with the optional gate 850, the correlation of Vdet_gated(t) 860 with the second harmonic basis signal Fcorr_2x 885 is provided to the filter 820.

The filter 820 accumulates the output of correlator 810 and provides the phase offset $\Phi_{align}$ 830 to the frequency modulator 880 for use in phase alignment of Fcorr 684, Fcorr_q 705, and Fcorr_2x 885. The phase offset $\Phi_{align}$ 830 can be calculated independently for each FM modulation index Δf0 394A and Δf1 394B and adjusted such that the correlation of the second harmonic basis signal Fcorr 2x 885 with either adc_out 570 or Vdet_gated(t) 860 averages to zero across PVT variations.

Figure 9:
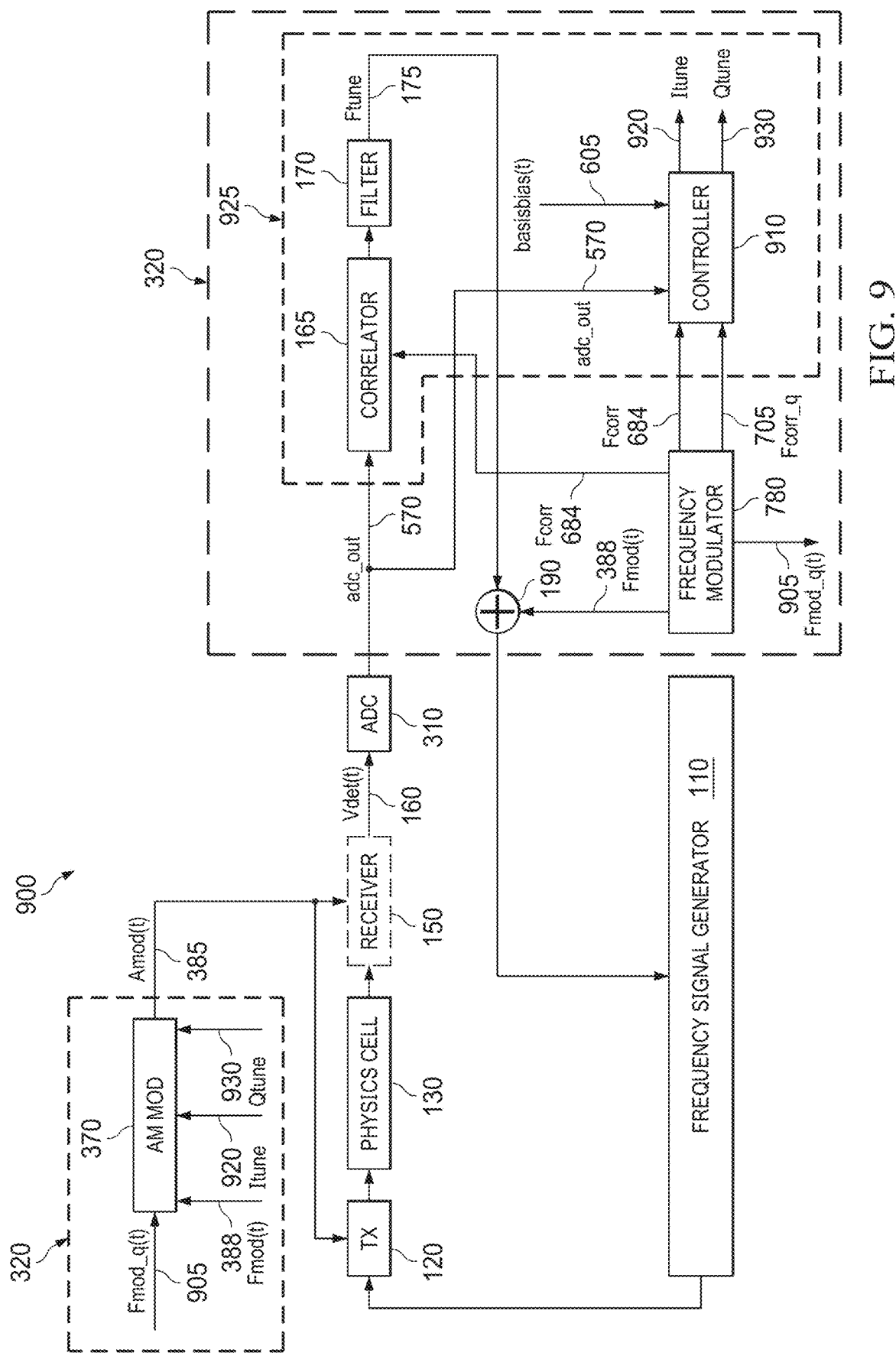
FIG. 9 shows a block diagram of the example bias correction circuit shown in FIG. 3A with in-phase and quadrature-based amplitude modulation.

FIG. 9 shows a block diagram of an example bias correction circuit 900 with in-phase and quadrature-based AM parameters for Amod(t) 385. The bias correction circuit 900 is similar to the bias correction circuit 300 shown in FIG. 3A but includes frequency modulator 780 shown in FIG. 7 instead of frequency modulator 360 and digital processing circuit 925 instead of digital processing circuit 325. The digital processing circuit 925 includes the correlator 165 and the filter 170 shown in FIG. 1A and also includes a controller 910. The frequency modulator 780 generates the correlation basis signals Fcorr 684 described herein with respect to FIG. 6A and Fcorr_q 705 described herein with respect to FIG. 7.

The frequency modulator 780 provides Fcorr 684 to correlator 165 and both Fcorr 684 and Fcorr_q 705 to the controller 910, which also receives the digitized Vdet(t) 160, adc_out 570 output from ADC 310, and basisbias(t) 605 described herein with respect to FIG. 6A. The controller 910 performs correlations and filtering as described herein with respect to FIG. 7 to generate the in-phase parameter $\Phi_{tune}$ 920 and the quadrature parameter Qtune 930 based on calculations of Atune and $\Phi_{tune}$. The controller 910 may optionally utilize gating as described herein with respect to FIG. 8A. Itune 920 and Qtune 930 are provided to AM modulator 370, as well as Fmod(t) 388 and Fmod_q(t) 905. Fmod_q(t) 905 represents the quadrature version of Fmod(t) 388. AM modulator 370 then generates Amod(t) 385 based on Fmod(t) 388, Fmod_q(t) 905, Itune 920, and Qtune 930.

Figure 10A:
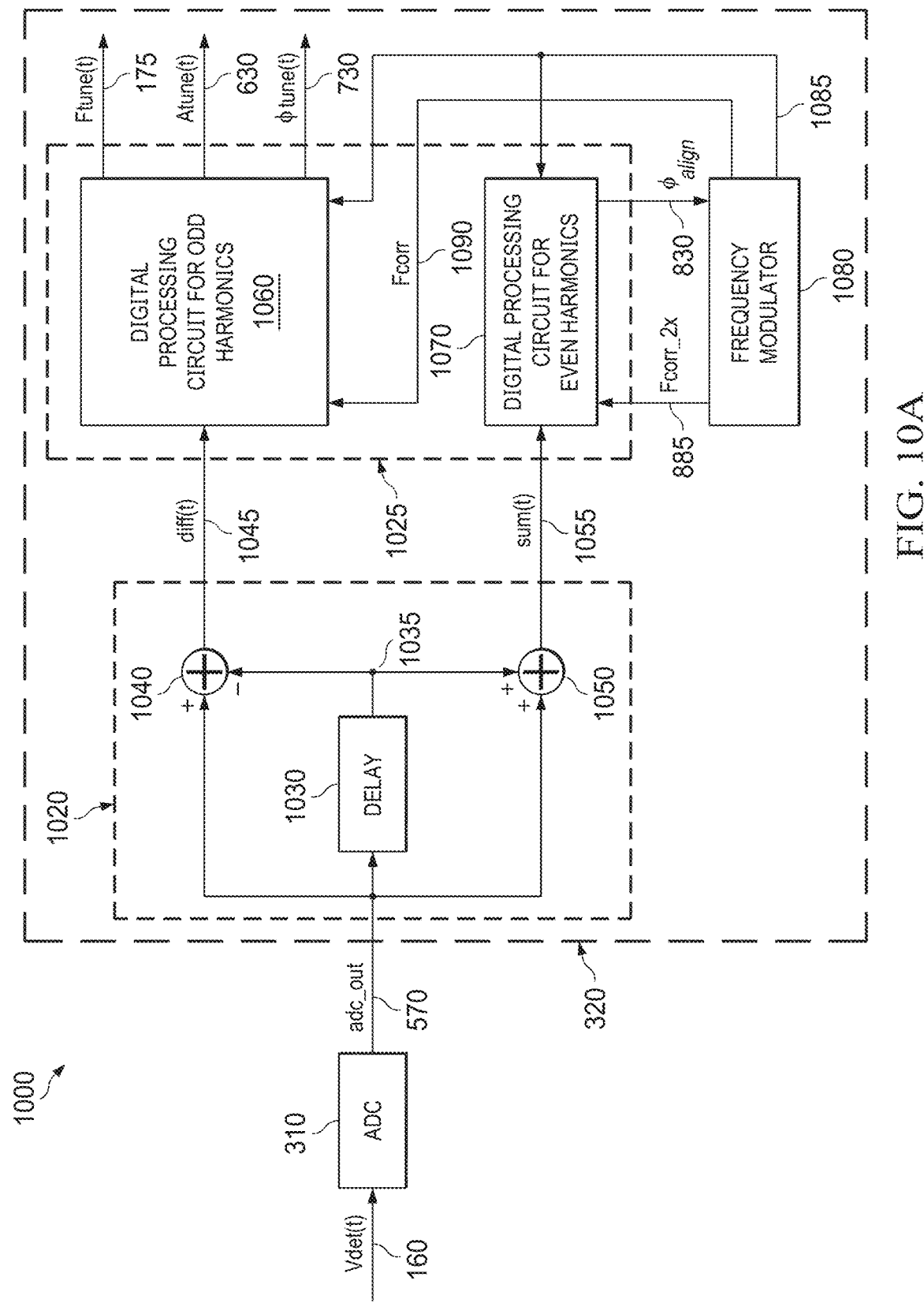
FIG. 10A shows a block diagram of an example bias correction circuit with digital processing of even and odd harmonics obtained from digital filtering.

FIG. 10A shows a block diagram of an example bias correction circuit 1000 with a digital filtering system 1020 that separates even and odd harmonics for digital processing. The example bias correction circuit 1000 is similar to the bias correction circuit 800 shown in FIG. 8A, but includes frequency modulator 1080 instead of frequency modulator 880 and digital processing circuit 1025 instead of digital processing circuit 825. For ease of illustration, the correlations and accumulations performed by correlators 165, 610, and 710 and filters 170, 620, and 720 are shown as digital processing circuit for odd harmonics 1060, and the correlations and accumulations performed by correlator 810 and filter 820 are shown as digital processing circuit for even harmonics 1070. The bias correction circuit 1000 is described with respect to FIGS. 3A, 5, and 8A. The DC cancellation loop 375 described in FIG. 5 can be included in the example bias correction circuit 1000, but is omitted for ease of illustration.

The frequency modulator 1080 provides the second harmonic signal Fcorr 2x 885 to the digital processing circuit for even harmonics 1070 and receives the phase alignment $\Phi_{align}$ 830. The frequency modulator 1080 also provides the timing signal 1085 and the correlation signal Fcorr 1090 to the digital processing circuit for odd harmonics 1060. The correlation signal Fcorr 1090 includes the correlation signals Fcorr 684 and Fcorr_q 705. The timing signal 1085 includes a first timing signal mod_bool 1085A and a second timing signal mod_bias_bool 1085B, described further herein with respect to FIG. 10B.

The signal Vdet(t) 160 is input to ADC 310, which outputs the signal adc_out 570 to the delay circuit 1030 and positive inputs of adders 1040 and 1050 in digital filtering system 1020. The delay 1030 introduces a delay of Tmod 398 divided by two, and provides the delayed signal 1035 to a negative input of adder 1040 and a positive input of adder 1050. The output of adder 1040 is the difference signal diff(t) 1045, which includes only odd harmonics, including the fundamental harmonic, of Fmod(t) 398 present in adc_out 570. The absence of even harmonics in signal diff(t) 1045 allows reduction of the bit-width requirements of multipliers and other calculations performed by digital processing circuit for odd harmonics 1060. Similarly, the output of adder 1050 is the sum signal sum(t) 1055, which includes only even harmonics and can be used for calculation of $\Phi_{align}$ 830 for timing alignment.

Figure 10B:
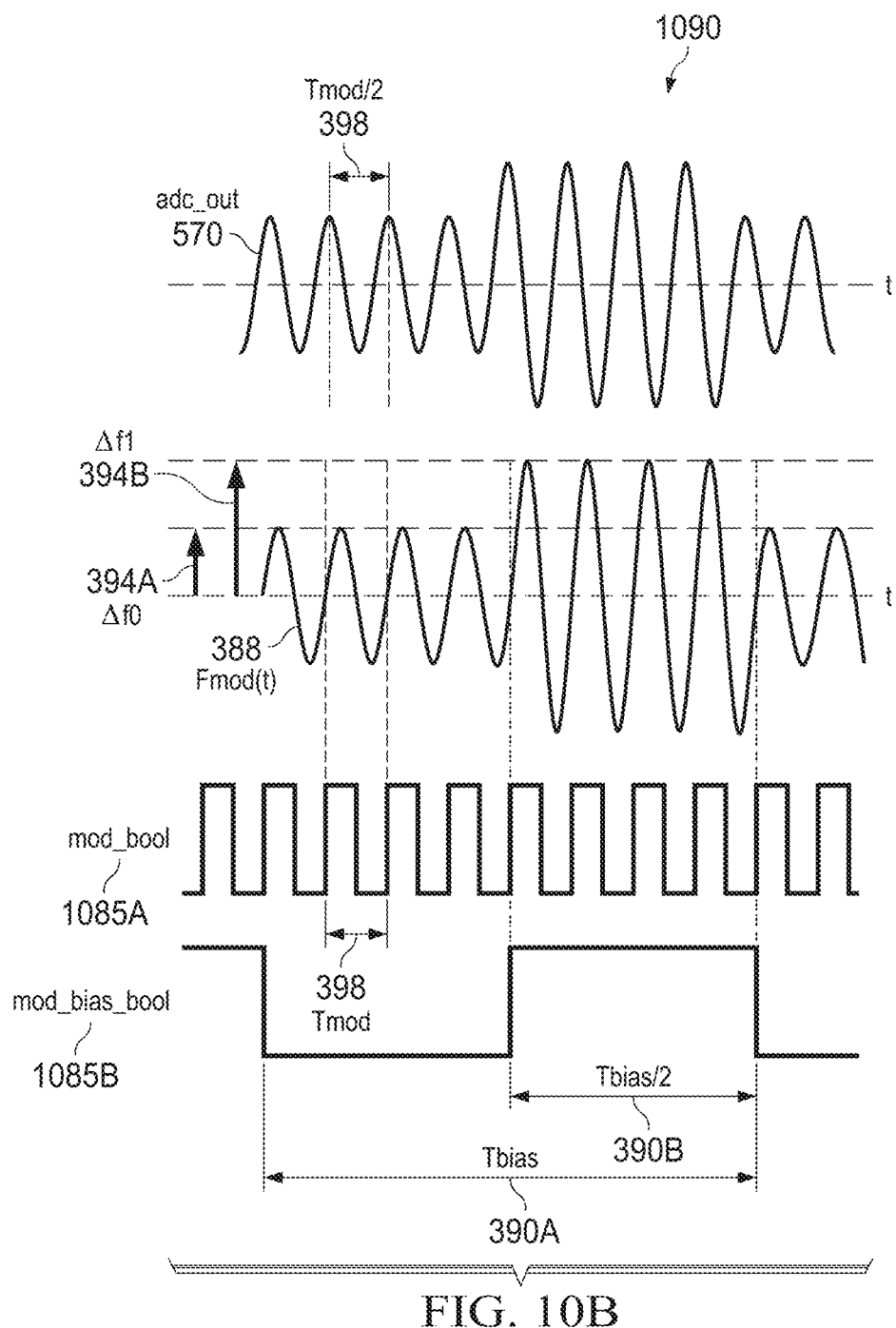
FIG. 10B shows graphs of signals generated in the example bias correction circuit shown in FIG. 10A.

FIG. 10B shows a graph 1090 of the timing signals 1085, Fmod(t) 388, and adc_out 570 generated in the example bias correction circuit shown in FIG. 10A. The signal adc_out 570 has a period corresponding to approximately half the period Tmod 398 of Fmod(t) 388 assuming steady state operation of frequency tuning and bias correction which suppresses the fundamental and odd harmonics of Fmod(t) 388 present in adc_out 570. The mod_bool signal 1085A and Fmod(t) signal 388 both have period Tmod 398. The mod_bias_bool signal 1085B has period Tbias 390A which is the same as the period of basisbias(t) signal 605.

Figure 11A:
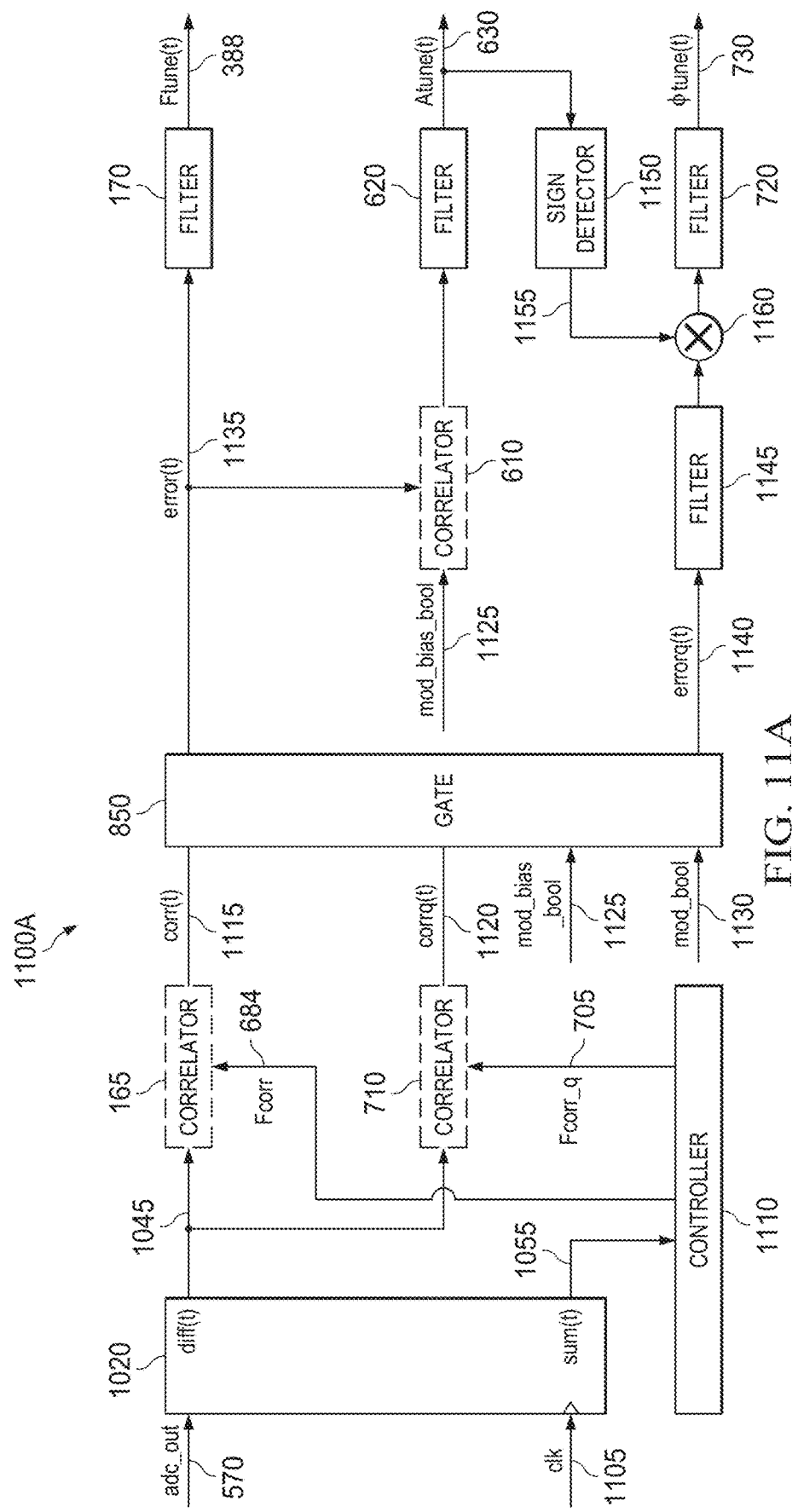
FIGS. 11A-B show block diagrams of other example bias correction circuits with digital filtering.

FIG. 11A shows a block diagram of an example bias correction circuit 1100A with digital filtering system 1020. For ease of illustration, the bias correction circuit 1100A is described with reference to the bias correction circuit 1000 shown in FIG. 10A, and includes the digital filtering system 1020; the correlators 165, 610, 710; filters 170, 620, and 720, and 1145; gate 850; controller 1110; a sign detector 1150, and multiplier 1160. The digital filtering system 1020 receives adc_out 570 and a first clocking signal clk 1105, and outputs the difference signal diff(t) 1045 to correlators 165 and 710 and the sum signal 1055 to controller 1110. The controller 1110 represents the digital processing circuit for even harmonics 1070 and the frequency modulator 1080, and generates the correlation signal Fcorr 684 for correlator 165 and the correlation signal Fcorr_q 705 for correlator 710.

The output correlation corr(t) 1115 from correlator 165 and output correlation corrq(t) 1120 from correlator 710 are provided to gate 850, as well as the timing signals mod_bias_bool 1125 and mod_bias 1130 which are used to zero out the values of corr(t) 1115 and corrq(t) 1120 following bias modulation transitions. The gated correlation corr(t) 1115 is called error(t) 1135 and is provided to the filter 170 and to the correlator 610. The filter 170 accumulates error(t) 1135 to generate the tuning signal Ftune(t) 175. The correlator 610 also receives the timing signal mod_bias_bool 1125 and provides the correlation to filter 620, which accumulates it to generate Atune(t) 630.

The gated correlation corrq(t) 1120 from gate 850 is called errorq(t) 1140 and is provided to the correlator 1145. The output of the correlator 1145 is provided to the multiplier 1160. Atune(t) 630 is provided to the sign detector 1150, which generates a signal 1155 that is a positive one or a negative one based on the sign of Atune(t) 630. The signal 1155 is provided to the multiplier 1160, which multiplies it with the correlation output from correlator 1145. The result is provided to filter 720, which accumulates it to generate the phase tuning signal $\Phi_{tune}$ (t) 730. The AM phase tuning signal path is stabilized by changing the sign of the feedback loop via signal 1155 as controlled by the instantaneous sign of Atune(t) 630.

Figure 11B:
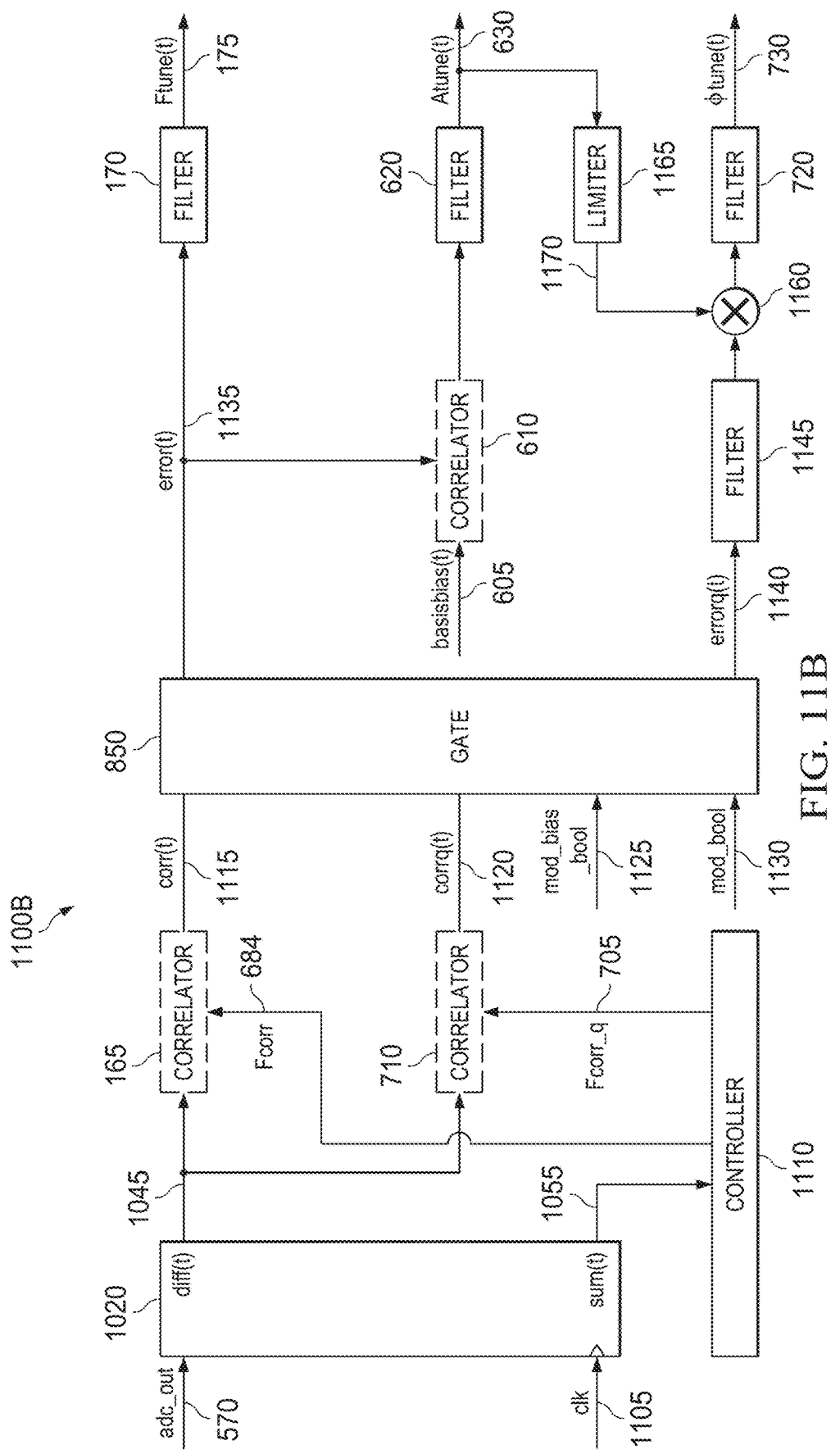

FIG. 11B shows a block diagram of another example bias correction circuit 1100B with digital filtering system 1020. Bias correction circuit 1100B is similar to the bias correction circuit 1100A shown in FIG. 11A, but includes the limiter circuit 1165 instead of the sign detector 1150. The limiter circuit 1165 receives Atune(t) 630 from the filter 620 and scales its inverse to apply as a scale factor for the AM phase tuning feedback loop and also implements maximum and minimum thresholds to prevent overly large gain, which can improve the bandwidth consistency, that is, the consistency of the convergence time of the AM phase tuning signal path. The output 1170 of the limiter circuit 1165 can be represented as:

$$\text{output } 1170 = \lim\left(\frac{K_\Phi}{Atune(t)630}\right)$$

where $K_\Phi$ represents the scaling factor to be applied to the inverse of Atune(t) 630 and the limit function implements positive and negative limits according to the sign of Atune(t) 630.

Figure 12A:
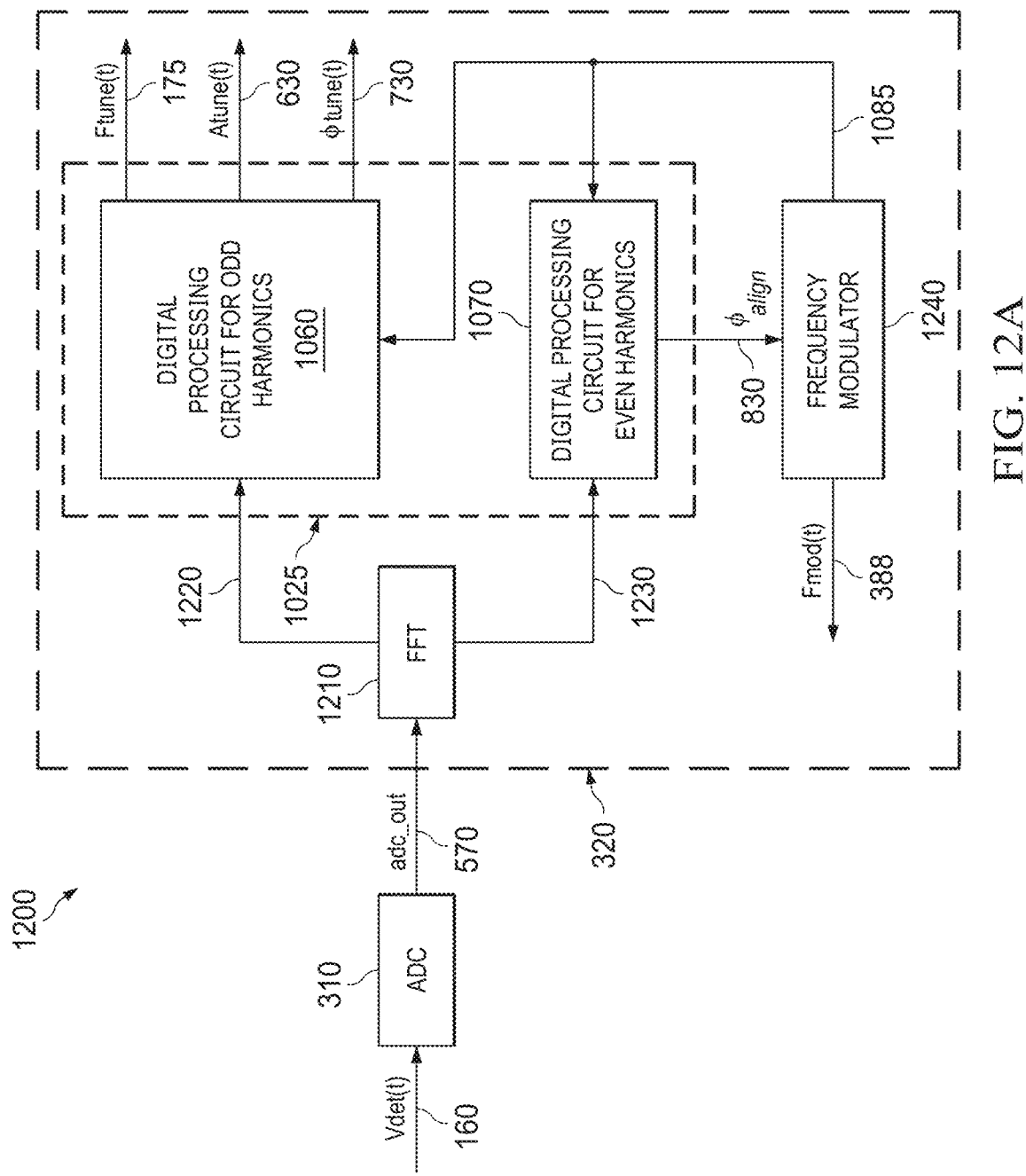
FIG. 12A shows a block diagram of an example bias correction circuit utilizing fast Fourier transform (FFT) based processing.

FIG. 12A shows a block diagram of an example bias correction circuit 1200 with fast Fourier transform (FFT) based processing. The bias correction circuit 1200 is described herein with respect to the bias correction circuit 1000 shown in FIG. 10A, and includes the ADC 310, an FFT processor 1210, the digital processing circuit for odd harmonics 1060, the digital processing circuit for even harmonics 1070, and frequency modulator 1240. Vdet(t) 160 is input to ADC 310, which outputs adc_out 570. The FFT processor 1210 receives adc_out 570 and performs frame-based FFTs to separate the odd and even harmonics for the FM indexes Δf0 394A and Δf1 394B. The FFT processor 1210 can be implemented in hardware or in software, and the frame-based FFT may be chosen based on a desired latency of the bias correction circuit 1200.

The odd harmonics are output as signal 1220 to the digital processing circuit for odd harmonics 1060, which also receives the timing signal 1085 from frequency modulator 1240 and generates Ftune 175, Atune 630, and $\Phi_{tune}$ 730. The even harmonics are output as signal 1230 to the digital processing circuit for even harmonics 1070, which also receives the timing signal 1085 from frequency modulator 1240 and generates the phase alignment signal $\Phi_{align}$ 830. The frequency modulator 1240 also generates Fmod(t) 388.

In some implementations, the FFT processor 1210 can be used to extract the even and odd harmonics of multiple FM indexes simultaneously, and Fmod(t) 388 can include multiple FM indexes at different modulation frequencies simultaneously. For example, adc_out 570 can be influenced by Fmod(t) 388 such that Fmod(t) 388 is represented as:

Fmod(t)388=Δf(t)=Δf0(t)1255+Δf1(t)1260

Figure 12B:
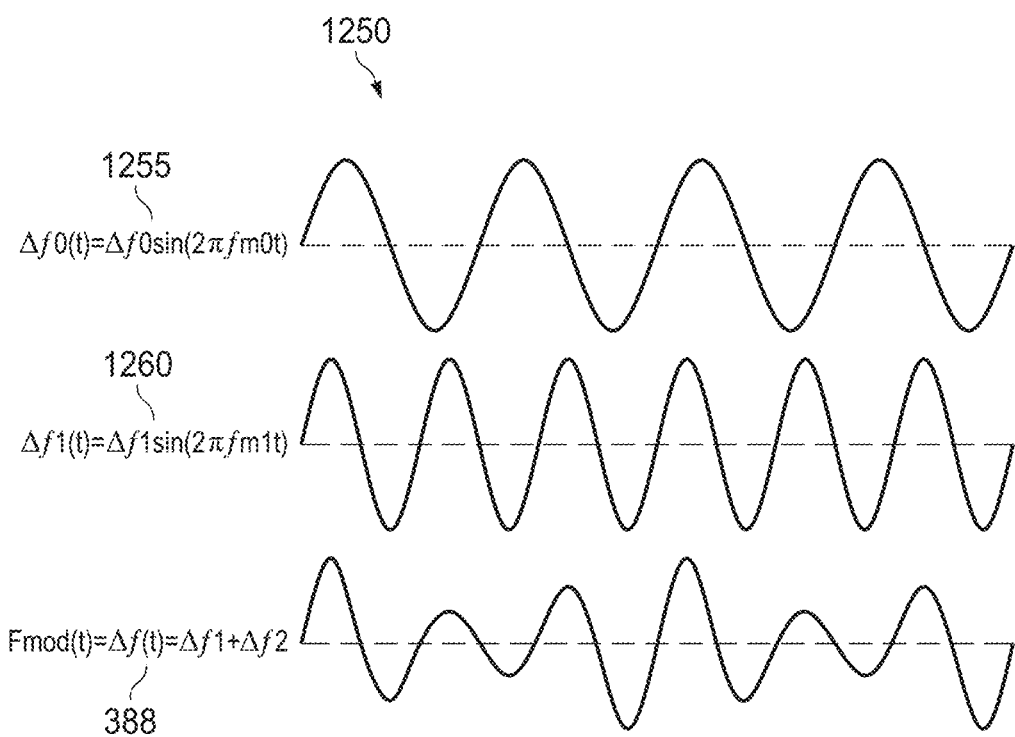
FIG. 12B shows graphs of signals generated in the example bias correction circuit shown in FIG. 12A.

Waveforms of Δf0(t) 1255 and Δf1(t) 1260 are shown in FIG. 12B, and the signal Δf0(t) 1255 is represented as:

Δf0(t)1255=(Δf0 394A)sin(2π(fm0)t)

where fm0 is a first modulation frequency. The signal Δf1(t) 1260 is represented as:

Δf1(t)1260=(Δf1 394B)sin(2π(fm1)t)

where fm1 is a second modulation frequency. The modulation frequencies fm0 and fm1 can be chosen such that these frequencies as well as their intermodulation products fall on exact FFT bins. For example, fm0 can be equal to four times f0, where f0 is the smallest FFT bin, and fm1 can be equal to six times f0.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

In this description, unless otherwise stated, "about," "approximately" or "substantially" preceding a parameter means being within +/− 10 percent of that parameter.

Modifications are possible in the described embodiments, and other embodiments are possible, within the scope of the claims.

What is claimed is:

1. A system, comprising:
   a signal generator circuit having a frequency modulation input and a signal generator output;
   a transmitter having a signal input, an amplitude modulation input, and a gas cell transmit output, the signal input coupled to the signal generator output;
   a frequency modulator having a frequency modulation control input and a frequency modulation output, the frequency modulation output coupled to the frequency modulation input;
   an amplitude modulator having an amplitude modulation control input and an amplitude modulation output, the amplitude modulation output coupled to the amplitude modulation input; and
   a processing circuit having a processing input, an amplitude modulation control output, and a frequency modulation control output, the amplitude modulation control output coupled to the amplitude modulation control input, and the frequency modulation control output coupled to the frequency modulation control input.

2. The system of claim 1, wherein
   the signal generation circuit is configured to provide a first signal at the signal generation output responsive to a frequency modulation signal at the frequency modulation input; and
   the transmitter is configured to provide a second signal at the gas cell transmit output responsive to the first signal at the signal input and an amplitude modulation signal at the amplitude modulation input.

3. The system of claim 1, wherein the processing circuit has a sensor input and configured to:
   receive a temperature sensor signal at the sensor input; and
   provide a frequency modulation control signal at the frequency modulation control output responsive to the temperature sensor signal.

4. The system of claim 1, further comprising a gas cell having a first terminal and a second terminal, the first terminal coupled to the gas cell transmit output, and the second terminal coupled to the processing input, wherein the gas cell is configured to receive a first signal at the first terminal and provide a second signal at the second terminal by removing a particular frequency component of the first signal.

5. The system of claim 1, wherein:

the system further comprises a feedback circuit having a gas cell receive input and a feedback output, the feedback output coupled to the processing input, and the feedback circuit configured to provide a DC bias correction signal at the feedback output responsive to a first signal at the gas cell receive input; and the processing circuit is configured to provide the at least one of a frequency modulation control signal at the frequency modulation control output or an amplitude modulation control signal at the amplitude modulation control output responsive to a difference between the first signal and the DC bias correction signal.

6. The system of claim 5, wherein the processing circuit includes an anti-aliasing filter configured to filter the difference, and the processing circuit is configured to provide the at least one of the frequency modulation control signal or the amplitude modulation control signal responsive to the filtered difference.

7. The system of claim 2, wherein the signal generation circuit includes:

a fractional-N synthesizer having a reference signal input, a synthesizer control input, and a synthesizer output, the synthesizer control input coupled to the frequency modulation input, and the fractional-N synthesizer configured to provide a third signal at the synthesizer output by multiplying a frequency of a reference signal at the reference signal input based on a state of the synthesizer control input; and a frequency multiplier having a multiplier input and a multiplier output, the multiplier input coupled to the synthesizer output, and the multiplier output coupled to the signal generation output.

8. The system of claim 7, wherein:

the processing circuit has a third control output and configured to provide a frequency modulation cancellation signal at the third control output; and the system further comprises a fractional-N frequency divider having a divider input, a divider control input, and a divider output, the divider input coupled to the synthesizer output, and the divider control input coupled to the third control output.

9. The system of claim 7, wherein:

the fractional-N synthesizer is a first fractional-N synthesizer;

the synthesizer output is a first synthesizer output;

the frequency modulation signal includes a frequency tuning component and a frequency modulated signal component;

the processing circuit has a third control output and configured to provide a third control signal at the third control output based on the frequency tuning component; and the system further comprises a second fractional-N synthesizer having the reference signal input, a second synthesizer control input, and a second synthesizer output, the frequency tuning input coupled to the third control output.

10. The system of claim 7, wherein:

the fractional-N synthesizer is a first fractional-N synthesizer;

the synthesizer output is a first synthesizer output;

the reference signal input is a first reference signal input;

the frequency modulation signal includes a frequency tuning component and a frequency modulated signal component;

the processing circuit has a third control output and configured to provide a third control signal at the third control output based on the frequency tuning component; and the system further comprises a second fractional-N synthesizer having a second reference signal input, a second synthesizer control input, and a second synthesizer output, the second synthesizer control input coupled to the third control output, and the second synthesizer output coupled to the first reference signal input.

11. The system of claim 7, wherein:

the frequency modulation signal includes a frequency tuning component and a frequency modulated signal component;

the processing circuit has a third control output and configured to provide a third control signal at the third control output based on the frequency tuning component; and the signal generation circuit includes a reference signal generator having a frequency tuning input and a reference signal output, the frequency tuning input coupled to the third control output, and the reference signal output coupled to the reference signal input.

12. The system of claim 11, wherein the processing circuit has a sensor input and configured to:

receive a temperature sensor signal at the sensor input; and provide the third control signal at the third control output responsive to the temperature sensor signal.

13. The system of claim 1, wherein the processing circuit is configured to provide a frequency modulation control signal at the frequency modulation control output, and the frequency modulation control signal includes a frequency tuning component and a frequency modulated signal component; and wherein the processing circuit is configured to:

perform a first correlation between a first signal at the processing input and a second signal including the frequency modulated signal component to generate a first correlation output signal, the second signal having a first frequency within a first interval and a second frequency within a second interval;

generate the frequency tuning component based on the first correlation output signal;

perform a second correlation between the first correlation output signal and a third signal to generate a second correlation output signal, the third signal alternating between a first state within the first interval and a second state within the second interval; and generate an amplitude modulation control signal at the amplitude modulation control output based on the second correlation output signal.

14. The system of claim 1, wherein the processing circuit is configured to provide a frequency modulation control signal at the frequency modulation control output, and the frequency modulation control signal includes a frequency tuning component and a frequency modulated signal component; and wherein the processing circuit is configured to generate the frequency tuning component, and an amplitude modulation control signal at the amplitude modulation control output, based on odd harmonic components of a signal at the processing input.

15. The system of claim 1, wherein the processing circuit is configured to provide an amplitude modulation control signal at the amplitude modulation control output, and the amplitude modulation control signal includes an in-phase parameter component and a quadrature parameter component.

16. A system comprising:
a signal generator circuit having a frequency modulation input and a signal generator output;
a transmitter having a signal input and a gas cell transmit output, the signal input coupled to the signal generator output;
a receiver having a gas cell receive input, an amplitude modulation input, and a receive output;
a frequency modulator having a frequency modulation control input and a frequency modulation output, the frequency modulation output coupled to the frequency modulation input;
an amplitude modulator having an amplitude modulation control input and an amplitude modulation output, the amplitude modulation output coupled to the amplitude modulation input; and
a processing circuit having a processing input, an amplitude modulation control output, and a frequency modulation control output, the process input coupled to the receive output, the amplitude modulation control output coupled to the amplitude modulation control input, and the frequency modulation control output coupled to the frequency modulation control input.

17. The system of claim 16, wherein
the signal generation circuit is configured to provide a first signal at the signal generation output responsive to a frequency modulation signal at the frequency modulation input.

18. The system of claim 16, wherein the processing circuit has a sensor input and configured to:
receive a temperature sensor signal at the sensor input; and
provide a frequency modulation control signal at the frequency modulation control output responsive to the temperature sensor signal.

19. The system of claim 16, further comprising a gas cell having a first terminal and a second terminal, the first terminal coupled to the gas cell transmit output, and the second terminal coupled to the gas cell receive input,
wherein the gas cell is configured to receive a first signal at the first terminal and provide a second signal by removing a particular frequency component of the first signal.

20. The system of claim 16, wherein:
the system further includes a feedback circuit having a feedback input and a feedback output, the feedback input coupled to the gas cell receive input, the feedback output coupled to the processing input, and the feedback circuit configured to provide a DC bias correction signal at the feedback output responsive to a first signal at the gas cell receive input; and
the processing circuit is configured to provide the at least one of a frequency modulation control signal at the frequency modulation control output or an amplitude modulation control signal at the amplitude modulation control output responsive to a difference between the first signal and the DC bias correction signal.

21. The system of claim 16, wherein the processing circuit further comprises a gating device coupled between the processing input and at least one of the amplitude modulation control output or the frequency modulation control output.

22. An apparatus, comprising:
a signal generator circuit having a frequency modulation input and a signal generator output;
a transmitter having a signal input and transmit output, the signal input coupled to the signal generator output;
a receiver having a receive input, an amplitude modulation input, and a receive output;
a gas cell coupled between the transmit output and the receive input;
a frequency modulator having a frequency modulation control input and a frequency modulation output, the frequency modulation output coupled to the frequency modulation input;
an amplitude modulator having an amplitude modulation control input and an amplitude modulation output, the amplitude modulation output coupled to the amplitude modulation input; and
a processing circuit having a processing input, an amplitude modulation control output, and a frequency modulation control output, the process input coupled to the receive output, the amplitude modulation control output coupled to the amplitude modulation control input, and the frequency modulation control output coupled to the frequency modulation control input.

23. The apparatus of claim 22, wherein
the signal generation circuit is configured to provide a frequency modulated signal at the signal generation output responsive to a frequency modulation signal at the frequency modulation input; and
the transmitter is configured to provide a first signal at the transmit output responsive to a second signal at the signal input and an amplitude modulation signal at the amplitude modulation input.

24. The apparatus of claim 23, wherein:
the apparatus further includes a feedback circuit having a feedback input and a feedback output, the feedback input coupled to the receive output, the feedback output coupled to the processing input, and the feedback circuit configured to provide a DC bias correction signal at the feedback output responsive to a third signal at the receive input; and
the processing circuit is configured to provide the at least one of a frequency modulation control signal at the frequency modulation control output or an amplitude modulation control signal at the amplitude modulation control output responsive to a difference between the third signal and the DC bias correction signal.

25. The apparatus of claim 22, further comprising a gating device coupled between the processing input and at least one of the frequency modulation control output or the amplitude modulation control output.

26. The apparatus of claim 22, wherein the processing circuit has a sensor input and configured to:
receive a temperature sensor signal at the sensor input; and
provide a frequency modulation control signal at the frequency modulation control output responsive to the temperature sensor signal.

* * * * *